(12) United States Patent
Weber et al.

(10) Patent No.: US 11,257,526 B2
(45) Date of Patent: *Feb. 22, 2022

(54) SECTOR-ALIGNED MEMORY ACCESSIBLE TO PROGRAMMABLE LOGIC FABRIC OF PROGRAMMABLE LOGIC DEVICE

(71) Applicant: Intel Corporation, Santa Clara, CA (US)

(72) Inventors: Scott J. Weber, Piedmont, CA (US); Sean R. Atsatt, Santa Cruz, CA (US); Ravi Prakash Gutala, San Jose, CA (US); Aravind Raghavendra Dasu, Milpitas, CA (US); Jun Pin Tan, Kuala Lumpur (MY)

(73) Assignee: Intel Corporation, Santa Clara, CA (US)

( * ) Notice: Subject to any disclaimer, the term of this patent is extended or adjusted under 35 U.S.C. 154(b) by 854 days.

This patent is subject to a terminal disclaimer.

(21) Appl. No.: 15/868,304

(22) Filed: Jan. 11, 2018

(65) Prior Publication Data

US 2019/0043536 A1 Feb. 7, 2019

(51) Int. Cl.
*G11C 5/02* (2006.01)
*H03K 19/1776* (2020.01)
*G11C 5/04* (2006.01)
*G11C 5/06* (2006.01)

(52) U.S. Cl.
CPC .............. *G11C 5/025* (2013.01); *G11C 5/04* (2013.01); *H03K 19/1776* (2013.01); *G11C 5/06* (2013.01)

(58) Field of Classification Search
CPC .. G11C 5/025; G11C 5/04; G11C 5/06; G11C 16/10; G11C 16/34; G11C 5/063; H03K 19/1776

USPC ............................................................ 365/51
See application file for complete search history.

(56) References Cited

U.S. PATENT DOCUMENTS

| | | | |
|---|---|---|---|
| 6,091,263 A * | 7/2000 | New | H03K 19/17752 326/39 |
| 7,973,555 B1 | 7/2011 | Trimberger et al. | |
| 8,296,578 B1 | 10/2012 | New | |
| 9,432,298 B1 | 8/2016 | Smith | |

(Continued)

OTHER PUBLICATIONS

Extended European Search Report for EP18211451.2 dated Mar. 22, 2019, pp. 1-9.

(Continued)

*Primary Examiner* — Hoai V Ho
*Assistant Examiner* — Minh Dinh
(74) *Attorney, Agent, or Firm* — Fletcher Yoder P.C.

(57) ABSTRACT

An integrated circuit device may include programmable logic fabric on a first integrated circuit die and sector-aligned memory on a second integrated circuit die to enable large amounts of data to be rapidly processed by a sector of programmable logic of the programmable logic device. The programmable logic fabric may include a first and second sectors. The first sector may be programmed with a circuit design that operates on a first set of data. The sector-aligned memory may include a first sector of sector-aligned memory directly accessible by the first sector of programmable logic fabric and a second sector of sector-aligned memory directly accessible by the second sector of programmable logic fabric. The first sector of sector-aligned memory may store the first set of data.

20 Claims, 15 Drawing Sheets

(56) References Cited

U.S. PATENT DOCUMENTS

2014/0035642 A1 2/2014 Venkata et al.
2019/0043536 A1* 2/2019 Weber ............... H03K 19/1776

OTHER PUBLICATIONS

Communication Pursuant to Article 94(3) EPC for EP Application No. 18211451.2 dated Jul. 15, 2021.

* cited by examiner

SECTOR-ALIGNED MEMORY ACCESSIBLE TO PROGRAMMABLE LOGIC FABRIC OF PROGRAMMABLE LOGIC DEVICE

BACKGROUND

This disclosure relates to accessing a sector-aligned memory using programmable logic fabric of a programmable logic device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that can be programmed to perform a wide variety of operations. A programmable logic device may include programmable logic elements programmed by a form of memory known as configuration random access memory (CRAM). Thus, to program a circuit design into a programmable logic device, the circuit design may be compiled into a bitstream and programmed into CRAM cells. The values programmed into the CRAM cells define the operation of programmable logic elements of the programmable logic device.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. The circuit designs that define accelerator functions may benefit from access to a large amount of data stored in memory. Accessing an external memory device may be a relatively slow process, however, and so some programmable logic devices may include in-fabric memory in the form of arrays of local memory accessible to the programmable logic fabric.

The capacity of the in-fabric memory is space-limited, however, since the in-fabric memory may take up die space that would otherwise contain configuration memory for programmable logic elements. Increasing the amount of in-fabric memory may thus reduce the number of available programmable logic elements. As a consequence, accelerator designers may face a dilemma between faster operating times with lower-capacity in-fabric memory and slower operating times with higher-capacity external memory.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
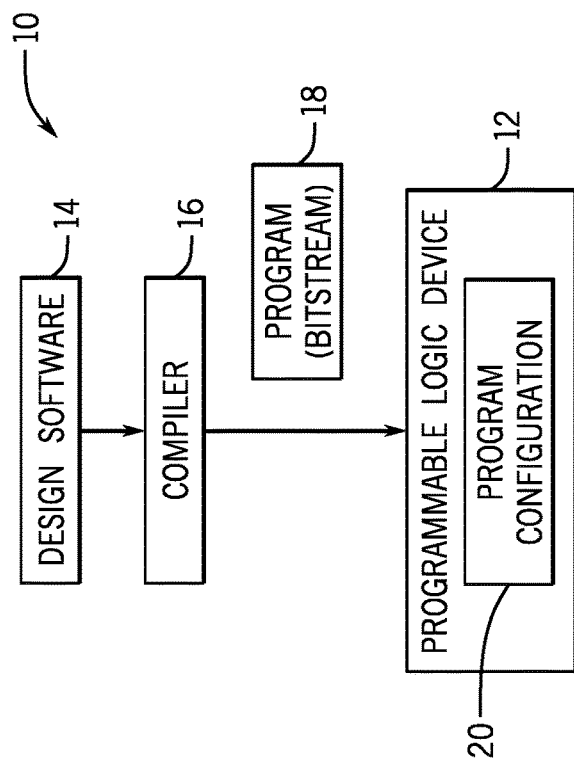
FIG. 1 is a block diagram of a programmable logic device that is programmed with a circuit design, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. The circuit designs that define an accelerator function may benefit from access to a large amount of data stored in memory. Since accessing an external memory device may be a relatively slow process, and the capacity of in-fabric memory may be limited, this disclosure describes a local memory that is neither directly within the programmable fabric nor external to the programmable logic device. In this disclosure, the memory is referred to as "sector-aligned memory," since the memory may have certain areas that are accessible to different respective areas of the programmable logic fabric.

In some cases, the programmable logic device may be composed of at least two separate die. The programmable logic device may include a first die that contains primarily programmable logic fabric, and a second die that contains fabric support circuitry to support the operation of the programmable logic fabric. For example, the second die may contain at least some fabric support circuitry that may operate the programmable logic fabric (e.g., the fabric support circuitry of the second die may be essential to the operation of the programmable logic fabric of the first die). Thus, the fabric support circuitry may include, among other things, a device controller (sometimes referred to as a secure device manager (SDM)), a sector controller (sometimes referred to as a local sector manager (LSM)), a network-on-chip (NOC), a configuration network on chip (CNOC), data routing circuitry, local (e.g., sectorized or sector-aligned) memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, or electrostatic discharge circuitry, to name just a few circuit elements that may be present on the second die. Indeed, in some embodiments, the first die may entirely or almost entirely contain programmable logic fabric, and the second die may contain all or almost all of the fabric support circuitry that controls the programmable logic fabric.

The fabric support circuitry may include the sector-aligned memory accessible to the programmable logic fabric. Since the sector-aligned memory may be located on a separate die from the programmable logic fabric, the sector-aligned memory may have a much larger capacity than a capacity of local in-fabric memory. Indeed, in some cases, the sector-aligned memory may have a capacity of one-thousand times or greater than the capacity of local in-fabric memory.

The sector-aligned memory may not only have a higher capacity than local in-fabric memory, but the sector-aligned memory may also have a higher bandwidth than an external memory device. The high bandwidth may be made possible by physically locating the sector-aligned memory near to the programmable logic fabric (e.g., in a base die vertically aligned with the fabric die) and/or by physically or logically dividing the sector-aligned memory into separate sectors that may transfer data in parallel to corresponding different sectors of the programmable logic fabric. This may also allow the sector-aligned memory to be secured from access by other sectors of the programmable logic fabric. Furthermore, depending on the physical arrangement of the first die that contains the programmable logic fabric and the second die that contains the fabric support circuitry (e.g., the sector-aligned memory), the sector-aligned memory may be pipelined into the programmable logic fabric, allowing for even faster data utilization.

With this in mind, FIG. 1 illustrates a block diagram of a system 10 that may employ a programmable logic device 12 that can rapidly access large amounts of local sector-aligned memory. Using the system 10, a designer may implement a circuit design functionality on an integrated circuit, such as a reconfigurable programmable logic device 12, such as a field programmable gate array (FPGA). The designer may implement a circuit design to be programmed onto the programmable logic device 12 using design software 14, such as a version of Intel® Quartus® by Intel Corporation of Santa Clara, Calif. The design software 14 may use a compiler 16 to generate a low-level circuit-design defined by bitstream 18, sometimes known as a program object file and/or configuration program, that programs the programmable logic device 12. Thus, the compiler 16 may provide machine-readable instructions representative of the circuit design to the programmable logic device 12. For example, the programmable logic device 12 may receive one or more configuration programs (bitstreams) 18 that describe the hardware implementations that should be stored in the programmable logic device 12. A configuration program (e.g., bitstream) 18 may be programmed into the programmable logic device 12 as a configuration program 20. The configuration program 20 may, in some cases, represent an accelerator function to perform for machine learning, video processing, voice recognition, image recognition, or other highly specialized task.

To carry out the systems and methods of this disclosure, the programmable logic device 12 may take any suitable form that includes a local memory having sufficient capacity and bandwidth to rapidly reprogram the programmable logic fabric (e.g., to rapidly reprogram the configurable random-access memory of the programmable logic fabric with a different configuration program (e.g., bitstream)). In some cases, the areas of the programmable logic fabric may be programmed in parallel by sector, from local memory associated with that sector, which is referred to in this disclosure as "sector-aligned memory." Sector-aligned memory may be incorporated into the programmable logic device on an integrated circuit die that is separate from, but nearby, the integrated circuit die that holds the sector programmable logic fabric, as will be described further below. The sector-aligned memory may also be incorporated into an integrated circuit die containing the programmable logic fabric if the sector-aligned memory has the capacity to store all or part of configuration data (bitstream) for programming that sector of programmable logic fabric.

Figure 2:
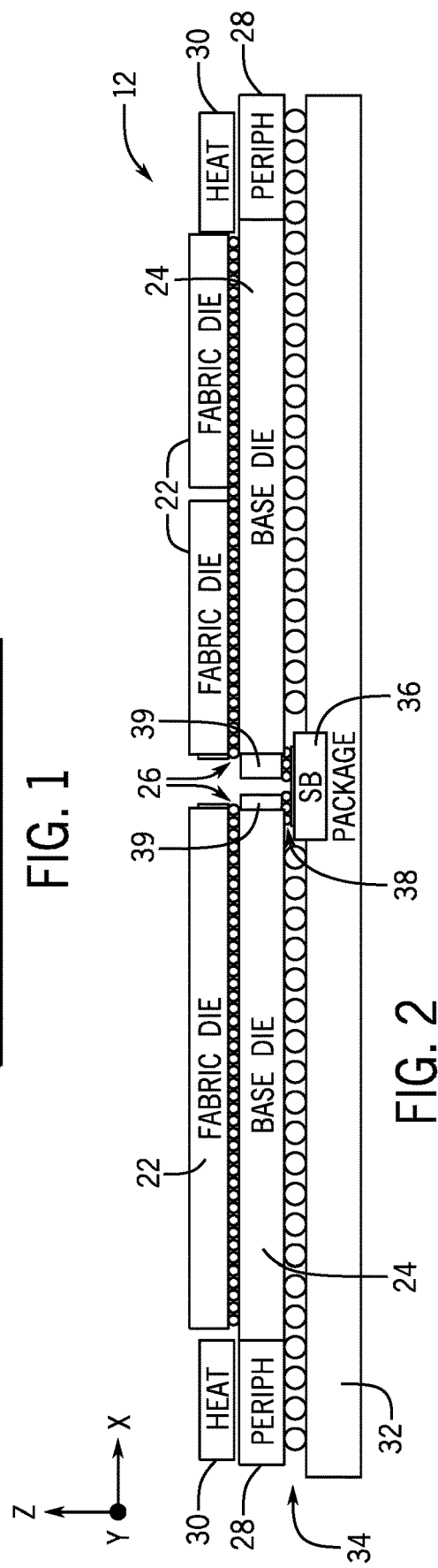
FIG. 2 is a block diagram of a package including the programmable logic device where a fabric die is vertically stacked with a base die, in accordance with an embodiment.

Thus, the programmable logic device 12 may have two separate integrated circuit die where at least some of the programmable logic fabric is separated from at least some of the fabric support circuitry that operates the programmable logic fabric, which may include local memory, such as sector-aligned memory. One example of the programmable logic device 12 is shown in FIG. 2, but any suitable programmable logic device having local memory of sufficient bandwidth and capacity may be used. In the example of FIG. 2, the programmable logic device 12 includes a fabric die 22 and a base die 24 that are connected to one another via microbumps 26. Although the fabric die 22 and base die 24 appear in a one-to-one relationship or a two-to-one relationship in FIG. 2, other relationships may be used. For example, a single base die 24 may attach to several fabric die 22, or several base die 24 may attach to a single fabric die 22, or several base die 24 may attach to several fabric die 22 (e.g., in an interleaved pattern along the x- and/or y-direction). Peripheral circuitry 28 may be attached to, embedded within, and/or disposed on top of the base die 24, and heat spreaders 30 may be used to reduce an accumulation of heat on the programmable logic device 12. The heat spreaders 30 may appear above, as pictured, and/or below the package (e.g., as a double-sided heat sink). The base die 24 may attach to a package substrate 32 via C4 bumps 34. In the example of FIG. 2, two pairs of fabric die 22 and base die 24 are shown communicatively connected to one another via a silicon bridge 36 (e.g., an embedded multi-die interconnect bridge (EMIB)) and microbumps 38 at a silicon bridge interface 39.

Figure 3:
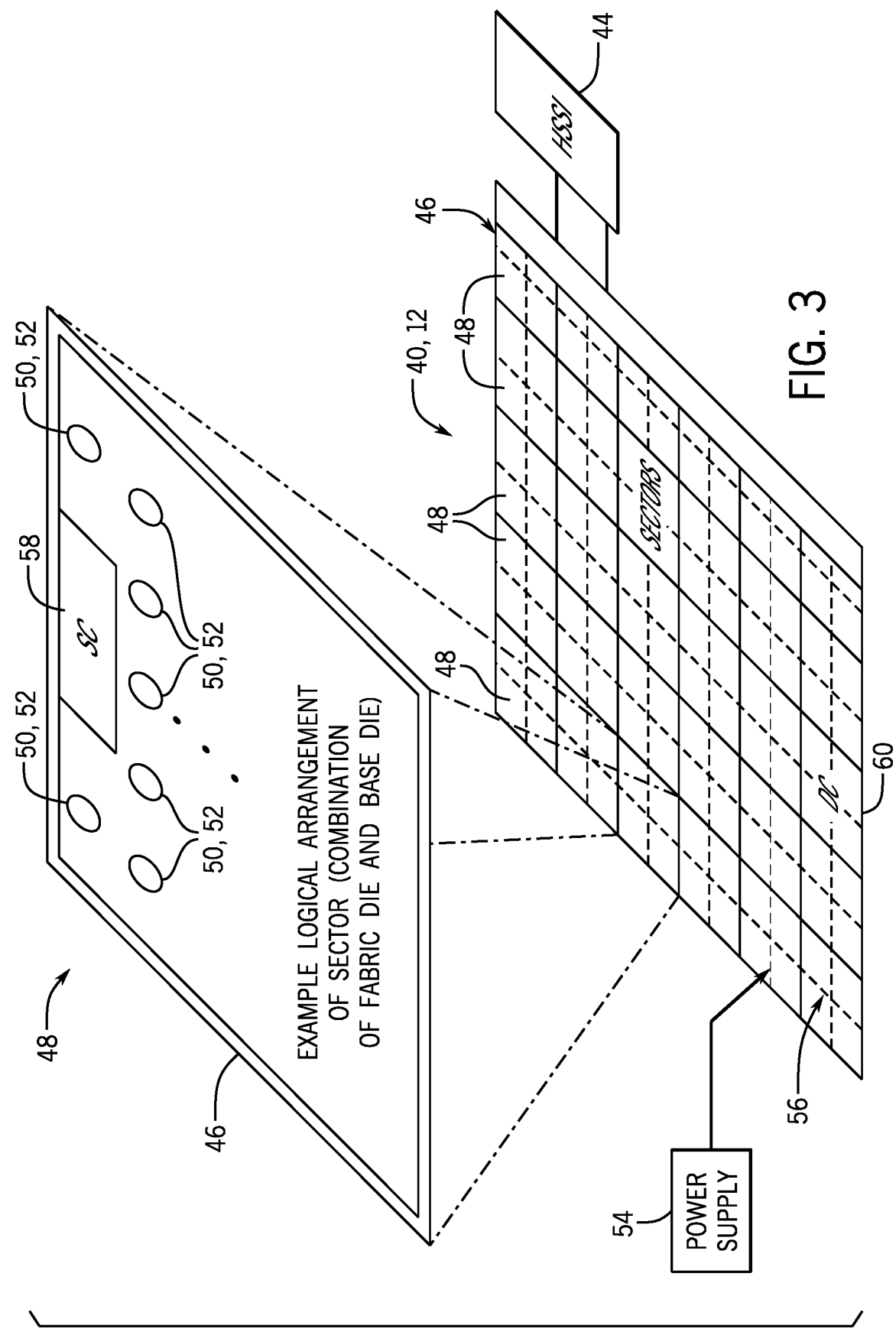
FIG. 3 is a block diagram of an example logical arrangement of the programmable logic device, in accordance with an embodiment.

In combination, the fabric die 22 and base die 24 may operate as a programmable logic device such as a field programmable gate array (FPGA). For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when the both the fabric die 22 and the base die 24 operate in combination. In other words, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as an FPGA, though it should be understood that the device may be any suitable type of programmable logic device (e.g., an application-specific integrated circuit and/or application-specific standard product).

In the example of FIG. 3, the FPGA 40 may include transceiver circuitry (HSSI) 44 for driving signals off of the FPGA 40 and for receiving signals from other devices. The transceiver circuitry (HSSI) may be part of the fabric die 22, the base die 24, or a separate die altogether. Interconnection resources 46 may be used to route signals, such as clock or data signals, through the FPGA 40. The FPGA 40 of FIG. 3 is shown to be sectorized, meaning that programmable logic resources may be distributed through a number of discrete programmable logic sectors 48. Each programmable logic sector 48 may include a number of programmable logic elements 50 having operations defined by configuration memory 52 (e.g., configuration random access memory (CRAM)). The programmable logic elements 50 may include combinational or sequential logic circuitry. For example, the programmable logic elements 50 may include look-up tables, registers, multiplexers, routing wires, and so forth. A designer may program the programmable logic elements 50 to perform a variety of desired functions. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 50, 100, or 1000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60, and may read data from and write data into its configuration memory 52 based on control signals from the device controller 60. In addition to these operations, the sector controller 58 and/or device controller 60 may be augmented with numerous additional capabilities. Such capabilities may include coordinating memory transactions between local in-fabric memory (e.g., local fabric memory or CRAM being used for data storage) and sector-aligned memory associated with that particular programmable logic sector 48, decrypting configuration data (bitstreams) 18, and locally sequencing reads and writes to implement error detection and correction on the configuration memory 52 and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data is loaded into the configuration memory 52 using pins 44 and input/output circuitry 42. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may configure the may be applied to the gates of metal-oxide-semiconductor (MOS) transistors that control the states of the programmable logic elements 50 or programmable components of the interconnection resources 46.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50 and configuration memory 52. In some cases, this may also entail certain fabric control circuitry such as the sector controller (SC) 58 or device controller (DC) 60. The base die 24 may include supporting circuitry to operate the programmable logic elements 50 and configuration memory 52. Shown here, the base die 24 includes sector 1 support circuitry 70A and sector 2 support circuitry 70B to support two corresponding sectors of the programmable logic elements 50 and configuration memory 52 of the fabric die 22. The base die 24 may also include support circuitry for other sectors of the fabric die 22.

Thus, while the fabric die 22 may include primarily programmable logic fabric resources, such as the programmable logic elements 50 and configuration memory 52, the base die 24 may include, among other things, a device controller (DC) 60, a sector controller (SC) 58, a network-on-chip (NOC), a configuration network on chip (CNOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, to name just a few elements that may be present on the base die 24. It should be understood that some of these elements that may be part of the fabric support circuitry of the base die 24 may additionally or alternatively be a part of the fabric die 22. For example, the device controller (DC) 60 and/or the sector controllers (SC) 58 may be part of the fabric die 22.

Figure 4:
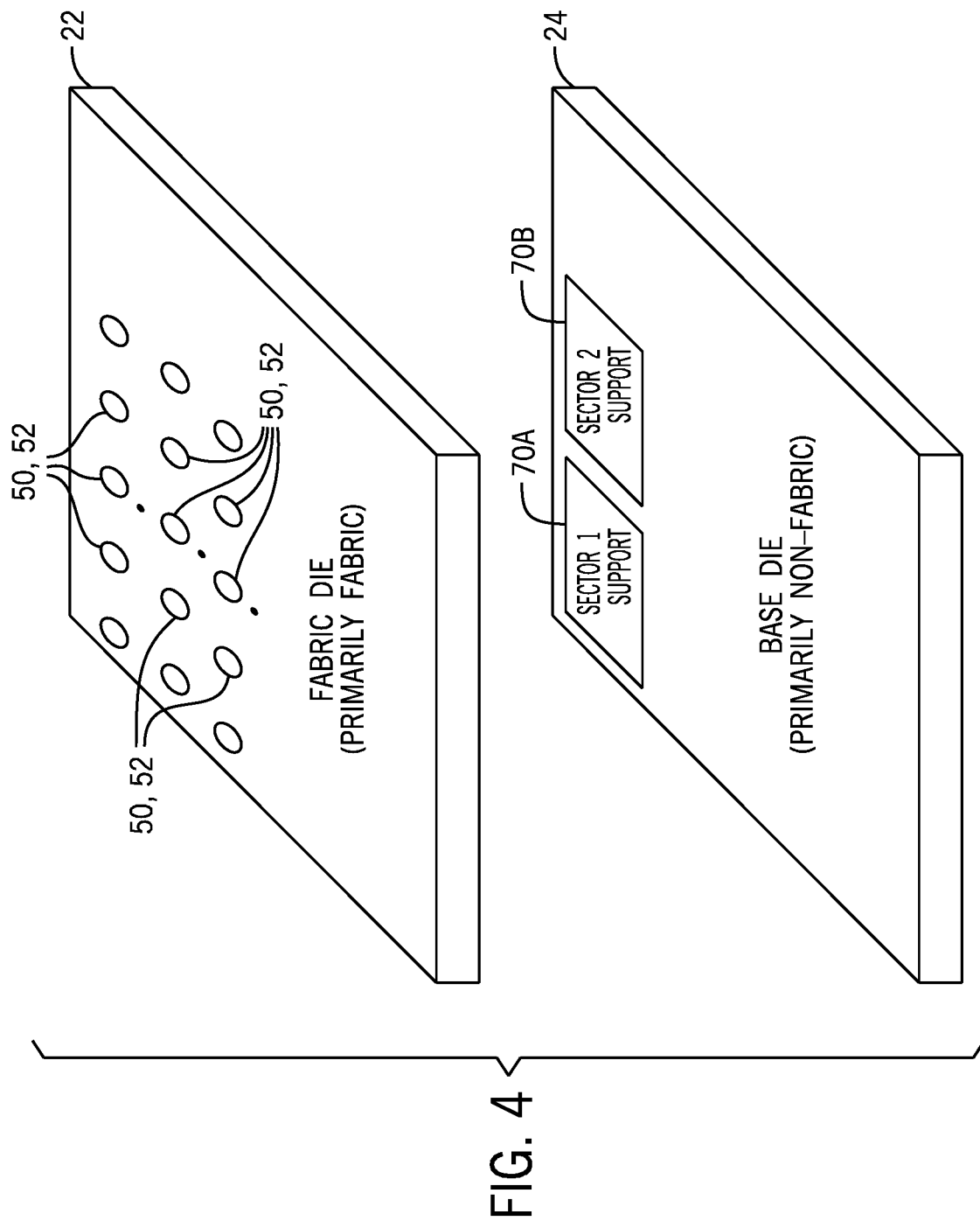
FIG. 4 is a block diagram showing a fabric die of the programmable logic device that contains programmable logic fabric and a base die of the programmable logic device that contains primarily non-fabric circuitry that operates the programmable logic fabric, in accordance with an embodiment.

While FIG. 4 represents an example where the fabric die 22 contains primarily programmable logic fabric, with most other components located in the base die 24, the fabric die 22 may contain some of the other components to support the programmable logic fabric. Thus, in some embodiments, the fabric die 22 may include one or more of a device controller (DC) 60, a sector controller (SC) 58, a network-on-chip (NOC), a configuration network on chip (CNOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, and other elements may be disposed on the base die 24.

Figure 5:
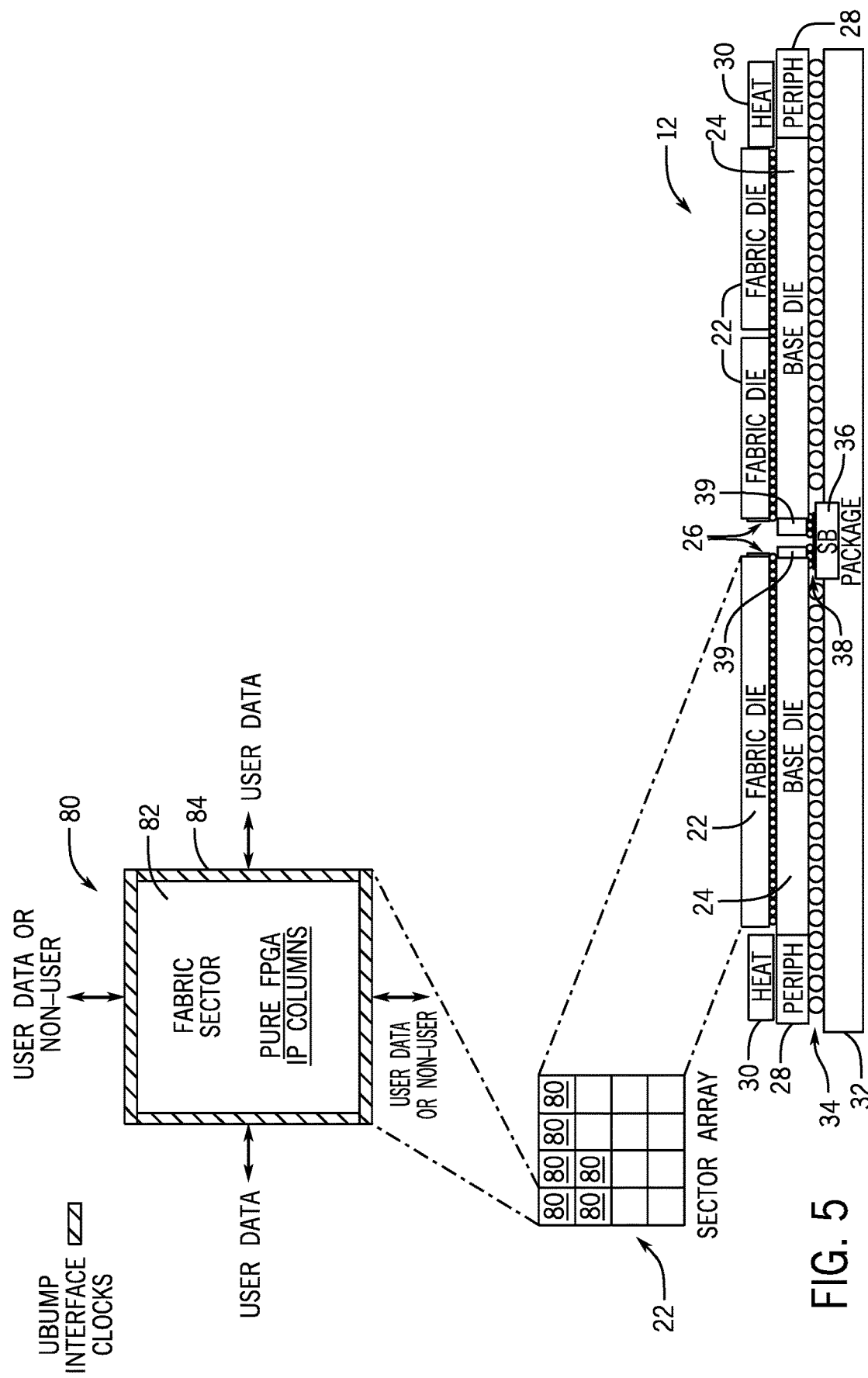
FIG. 5 is a block diagram of an example topology of the fabric die, in accordance with an embodiment.
Figure 6:
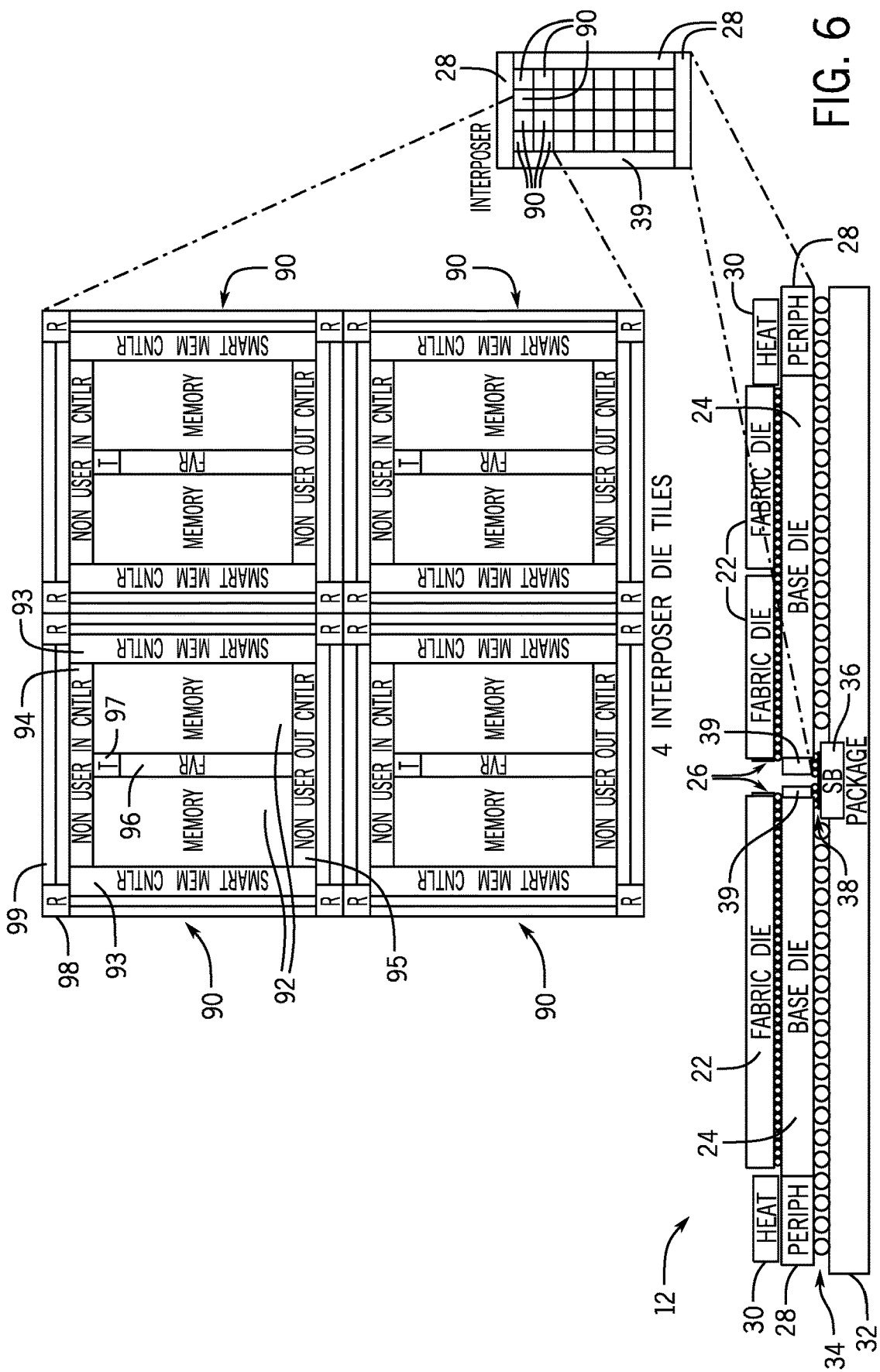
FIG. 6 is a block diagram of an example topology of the base die, in accordance with an embodiment.

One example physical arrangement of the fabric die 22 and the base die 24 is shown by FIGS. 5 and 6. In FIG. 5, the fabric die 22 is shown to contain an array of fabric sectors 80 that include fabric resources 82 (e.g., programmable elements programmed by CRAM and/or certain fabric control circuitry such as the sector controller (SC) 58 or device controller (DC) 60) and interface circuitry 84. The interface circuitry 84 may include data routing and/or clocking resources, or may include an interface to data routing and/or clocking resources on the base die 24. Thus, the interface circuitry 84 may connect with a micro-bump (ubump) interface to connect to the base die 24.

FIG. 6 provides a complementary arrangement of the base die 24. The base die 24 may represent an active interposer with several sectors 90 surrounded by peripheral circuitry 28 and the silicon bridge interface 39. Each sector 90 may include a variety of fabric support circuitry, such as sector-aligned memory 92, memory control circuitry 93, non-user input control circuitry 94, non-user output control circuitry 95, a voltage regulator such as a fully integrated voltage regulator (FIVR) 96, one or more thermal sensors 97, data and configuration routers 98, and/or data or configuration pathways 99. The memory control circuitry 93 may be used to program the sector-aligned memory 92, the CRAM of the fabric die 22, or both. The non-user input control circuitry 94 and non-user output control circuitry 95 may allow the circuitry of the sectors 90 to exchange data and/or control signals (e.g., via configurable data routing network-on-chip (NOC) or a configuration network on chip (CNOC)). In one example, the non-user input control circuitry 94 and non-user output control circuitry 95 may operate as the sector controller (SC) 58 for a corresponding fabric sector 80 (as shown in FIG. 5). The FIVR 96 and the one or more thermal sensors 97 may be used to provide a desired voltage to the corresponding fabric sector 80 (as shown in FIG. 5), enabling the voltage to be selectively scaled up or down, or removed, depending on power and thermal specifications (e.g., based at least in part on temperature as measured by a thermal sensor 97 and/or in accordance with a dynamic voltage and frequency scaling (DVFS) scheme). Even though the thermal sensors 97 are in a separate die from that of the programmable logic fabric elements, when the base die 24 is directly adjacent to the fabric die 22 as in this example, the temperature measured by the thermal sensor 97 in the base die 24 may correspond well enough to the fabric die 22 to allow for temperature-based operations (e.g., turn off power to the corresponding fabric sector 80 to prevent a permanent-denial-of-service (PDOS) condition).

Figure 7:
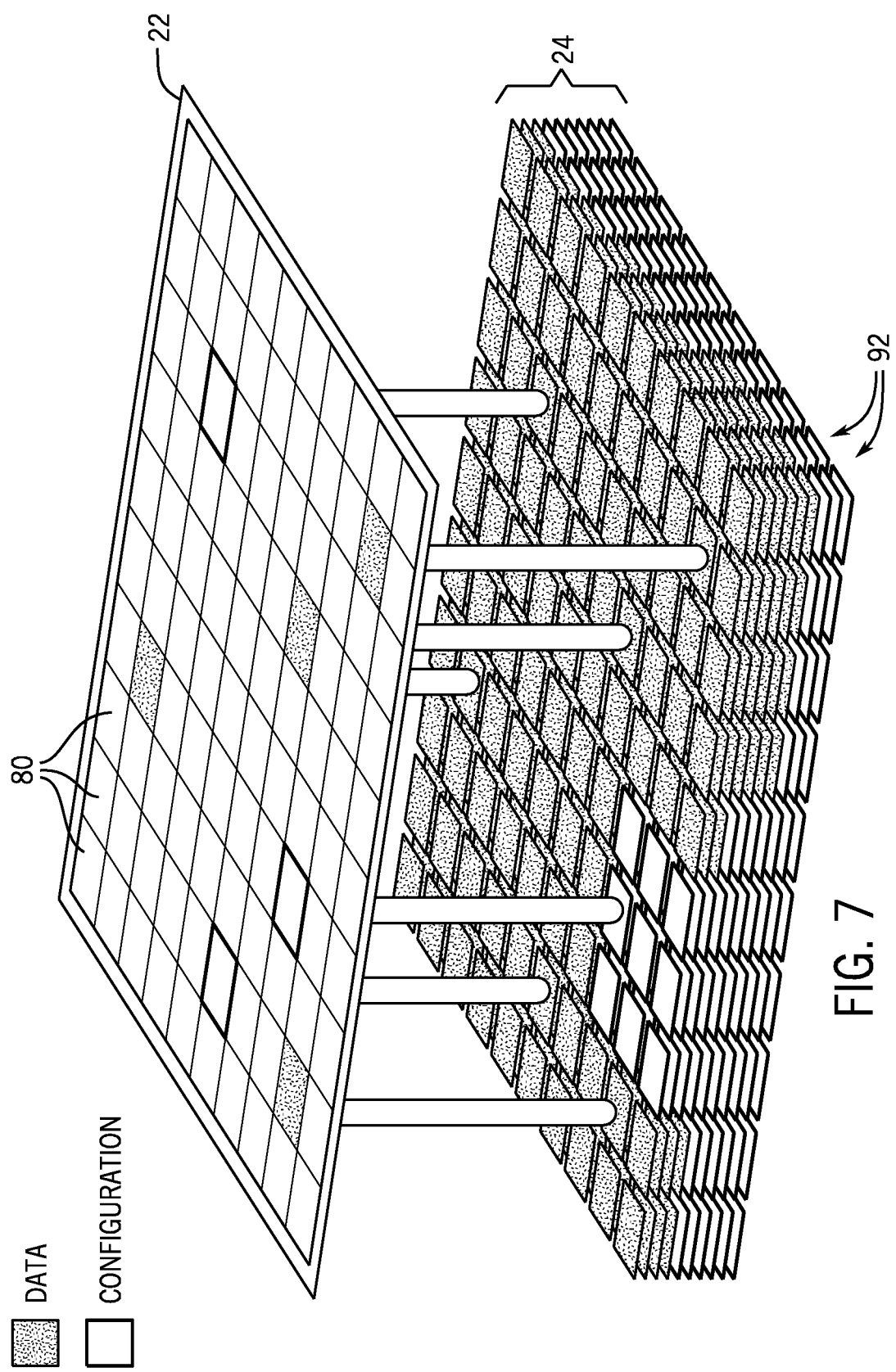
FIG. 7 is a schematic block diagram of sector-aligned memory of the base die that may support rapid configuration and/or caching for corresponding sectors of the fabric die, in accordance with an embodiment.

By vertically aligning the fabric die 22 and the base die 24, memory located in the base die 24 may be accessible in parallel to fabric sectors 80 of the fabric die 22. FIG. 7 shows an example in which sector-aligned memory 92 may be contained in the base die 24. The sector-aligned memory 92 may be directly accessible to respective fabric sectors 80 of the fabric die 22, and may contain user data (generated by or accessible by a circuit design programmed into the programmable logic fabric of the base die 24) or configuration data that may be used to program the programmable logic fabric of the base die 24. In this disclosure, "directly accessible" refers to a connection between a region of the sector-aligned memory 92 that is associated with a particular fabric sector 80 and that particular fabric sector 80. In some embodiments, each respective region of the sector-aligned memory 92 associated with a particular fabric sector 80 may be directly accessible to that particular fabric sector 80, thereby providing each fabric sector 80 with direct access to that region of the sector-aligned memory 92. For example, there may be N regions of sector-aligned memory 92 that can be accessible by N corresponding fabric sectors 80 at the same time (e.g., in parallel). In some cases, the sector-aligned memory 92 may be accessible to more than one fabric sector 80 or multiple sectors of sector-aligned memory 92 may be accessible to a single fabric sector 80. Thus, in some cases, the same region of sector-aligned memory 92 may be directly accessible to multiple fabric sectors 80, while in other cases, a region of sector-aligned memory 92 may be directly accessible only to a single fabric sector 80. In the example of FIG. 7, the fabric sectors 80 may access specific regions of sector-aligned memory 92. The sector-aligned memory 92 is shown in FIG. 7 as vertically stacked memory. This may allow a large amount of memory to be located within the base die 24. However, the sector-aligned memory 92 may occupy a single plane of the base die 24 in some embodiments.

Figure 8:
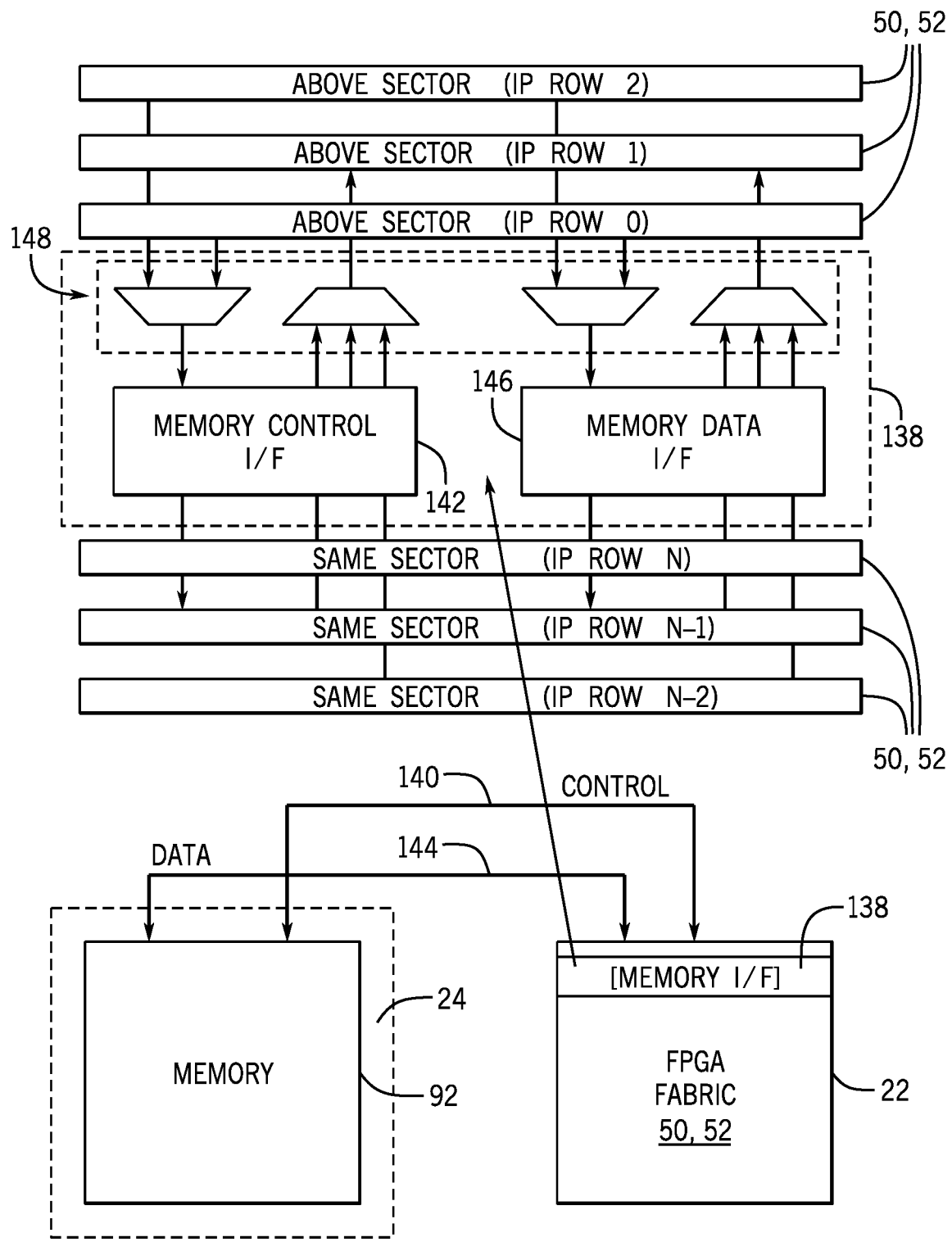
FIG. 8 is a block diagram of a memory interface of the fabric die to interface with the sector-aligned memory of the base die, in accordance with an embodiment

As shown in FIG. 8, the sector-aligned memory 92 of the base die 24 may be accessible by the programmable logic fabric (e.g., programmable logic elements 50 and associated configuration memory 52) of the fabric die 22 via a memory interface (I/F) 138. There may be one or more memory interfaces (I/F) 138 for each fabric sector, allowing different fabric sectors to access their respective sectors of the sector-aligned memory 92 in parallel. The memory interface (I/F) 138 may occupy a row of a fabric sector 80 and may be made of hardened logic or soft logic, or both. In the example of FIG. 8, the memory interface (I/F) 138 may occupy an outermost row of a fabric sector 80. This may allow the memory interface (I/F) 138 to facilitate communication not just with rows of programmable logic elements 50 and associated configuration memory 52 in the fabric sector 80 where the memory interface (I/F) 138 is located, but also with rows of programmable logic elements 50 and associated configuration memory 52 in an adjacent fabric sector 80.

The memory interface (I/F) 138 may receive or transmit data via a data path 140 to a memory data interface (I/F) 142 and may communicate control signals via a control signal path 144 to and from a memory control interface (I/F) 146. The memory interface (I/F) 138 may receive control and/or data signals and route them through the rows of programmable logic elements 50 and associated configuration memory 52 to a particular memory address or logic element via routing circuitry 148. The control signal path 144 and the data path 140 may represent a first physical connection between a first sector of programmable logic fabric and a first sector of the sector-aligned memory 92. It should be understood that similar pathways may represent a second physical connection between a second sector of programmable logic fabric and a second sector of the sector-aligned memory 92.

Regardless of its exact placement, the sector-aligned memory 92 may be located near enough to a particular area of the programmable logic fabric of the programmable logic device 12 to be able to provide very rapid data transfers. This may enable the sector-aligned memory 92 to be used for caching of data and/or configuration programs that may be programmed into the programmable logic fabric. One example of circuitry that may use the sector-aligned memory 92 appears in FIG. 9. The various components shown in FIG. 9 may be located in a single die or may be distributed through several die (e.g., distributed through the fabric die 22 or the base die 24). Indeed, when programmable logic device 12 includes the fabric die 22 and the base die 24, each element of circuitry represented by the block diagram of FIG. 9 may be found in at least one of the fabric die 22 and the base die 24, as desired. In many situations, however, the sector-aligned memory 92 may have a sufficiently high capacity that it may not fit in the fabric die 22, and thus may be located in the base die 24.

Figure 9:
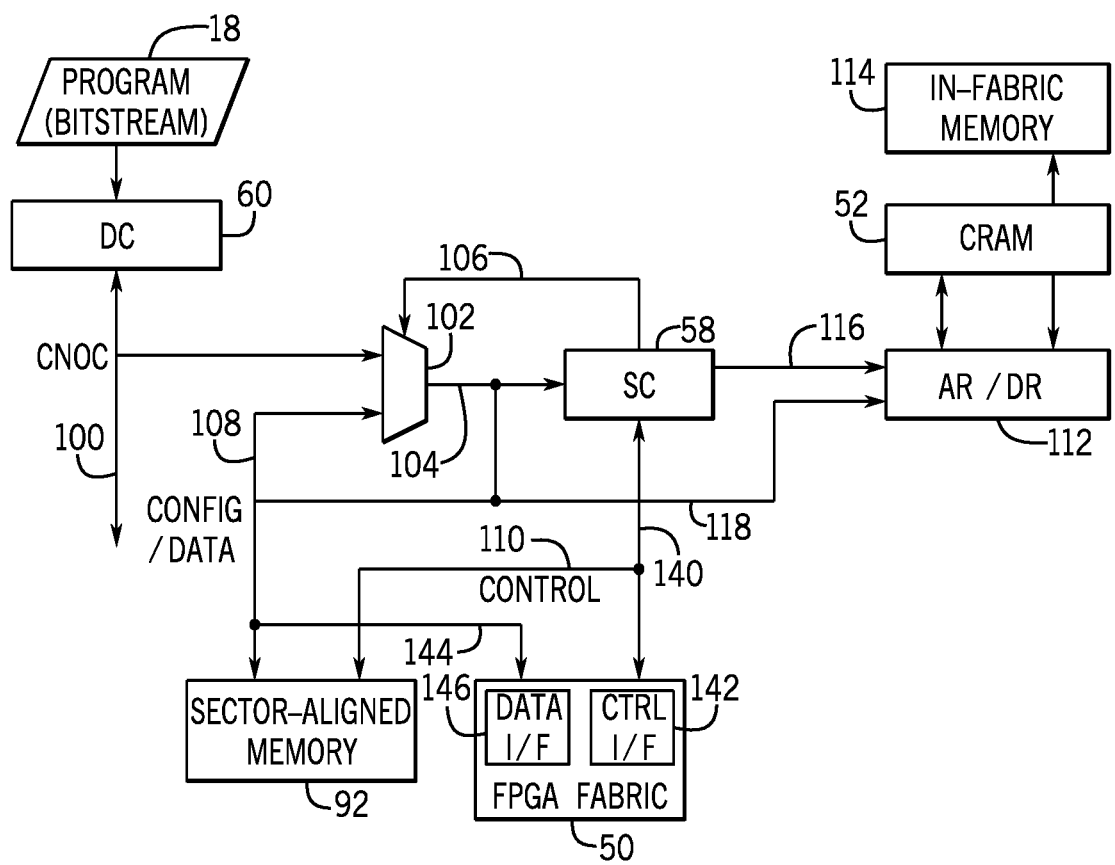
FIG. 9 is a block diagram of circuitry that may facilitate access to the sector-aligned memory by the programmable logic fabric using a sector controller, in accordance with an embodiment.

The circuitry shown in FIG. 9 includes the device controller (DC) 60 that may receive, among other things, a bitstream 18. The bitstream 18 may represent data that may be received by the device controller (DC) 60, such as configuration data that may program the configuration memory (CRAM) 52 of a particular sector of programmable logic elements (FPGA fabric) 50 and/or data that may be processed by the programmable logic fabric (e.g., in a request to accelerate a compute task). The device controller 60 may receive the bitstream 18 from an external data source, such as an external data storage device or external memory device, and may direct the bitstream 18 to the sector controller (SC) 58 of the particular sector via a configuration network on chip (CNOC) 100 or any other suitable pathway.

When the circuitry of FIG. 9 is used for configuring the programmable logic device elements 50 by programming the configuration memory (CRAM) 52, routing circuitry 102 (e.g., a multiplexer) may provide the bitstream 18 to the sector controller (SC) 58 via a main signal path 104. When directed by the bitstream 18, when determined by a routine running on the sector controller (SC) 58, and/or when directed by the circuit design programmed into the programmable logic elements 50, the sector controller (SC) 58 may issue a selection signal over a selection pathway 106 to direct the routing circuitry 102 to receive the bitstream 18 from the CNOC 100 or to receive data from the sector-aligned memory 92, and/or whether to cache the bitstream 18 into the sector-aligned memory 92. Based on the selection signal on the selection pathway 106, the routing circuitry 102 may provide either data on the CNOC 100 or on a data pathway 108 from the sector-aligned memory 92 to the sector controller (SC) 58. A control pathway 110 may enable control communication between the sector controller (SC) 58 and the sector-aligned memory 92. The sector controller (SC) 58 may use the control pathway 110 to cause the sector-aligned memory 92 to retrieve data from or store data into the sector-aligned memory 92.

A configuration program 20 implemented in the programmable logic fabric, as defined by the configuration of programmable logic elements 50 programmed by the configuration memory (CRAM) 52, may utilize the sector-aligned memory 92. The configuration program 20 programmed into the programmable logic elements 50 may do so in several ways. In one example, the configuration program 20 may directly access (e.g., read from or write to) the sector-aligned memory via the control pathway 140 coupled to the control interface (CTRL I/F) 142 and the data pathway 144 coupled to the data interface (DATA I/F) 146 for direct data transfers between the programmable logic fabric and the sector-aligned memory 92. The configuration program 20 may include a memory controller for the sector-aligned memory 92 implemented in the programmable logic elements 50, which may be referred to as a memory controller implemented in soft logic, or a hardened memory controller may be accessible to the control interface (CTRL I/F) 142 and the data interface (DATA I/F) 146. In another example, the configuration program 20 may communicate control signals to the sector controller (SC) 58 via the control pathway 140 instructing the sector controller (SC) 58 to coordinate a data transfer to or from the sector-aligned memory 92. The configuration program 20 thus may include a soft processor or soft state machine to communicate with the sector controller (SC) 58 in this way, or hardened control circuitry may be disposed among the programmable logic elements 50 to communicate with the sector controller (SC) 58.

A memory address register/data register (AR/DR) 112 may program the configuration memory (CRAM) 52 and/or in-fabric memory 114 based on instructions from the sector controller (SC) 58 on a control pathway 116 and using data received on a data pathway 118. In this way, the AR/DR 112 may rapidly program the CRAM 52 and/or in-fabric memory 114 with data, such as data from the bitstream 18 received on the CNOC 100 or directly from sector-aligned memory 92 when so instructed. This may take place much more quickly than the time involved in receiving the entire bitstream 18 via the CNOC 100, which may face latencies due to accessing a memory device external to the programmable logic device 12. In some cases, this may be 50% faster, twice as fast, 5× as fast, 10× as fast, 20× as fast, 50× as fast, 100× as fast, 200× as fast, 500× as fast, 1000× as fast, or faster, to program the CRAM 52 and/or in-fabric memory 114 with data directly from the sector-aligned memory 92 than to program the CRAM 52 and/or in-fabric memory 114 with the bitstream 18 from the CNOC 100. Here, it may also be noted that the amount of memory available in the in-fabric memory 114 may be much smaller than the amount of memory available in the sector-aligned memory 92. In fact, the sector-aligned memory 92 may have a capacity many times that of the in-fabric memory 114 (e.g., 10×, 100×, 1000×, or more).

Figure 10:
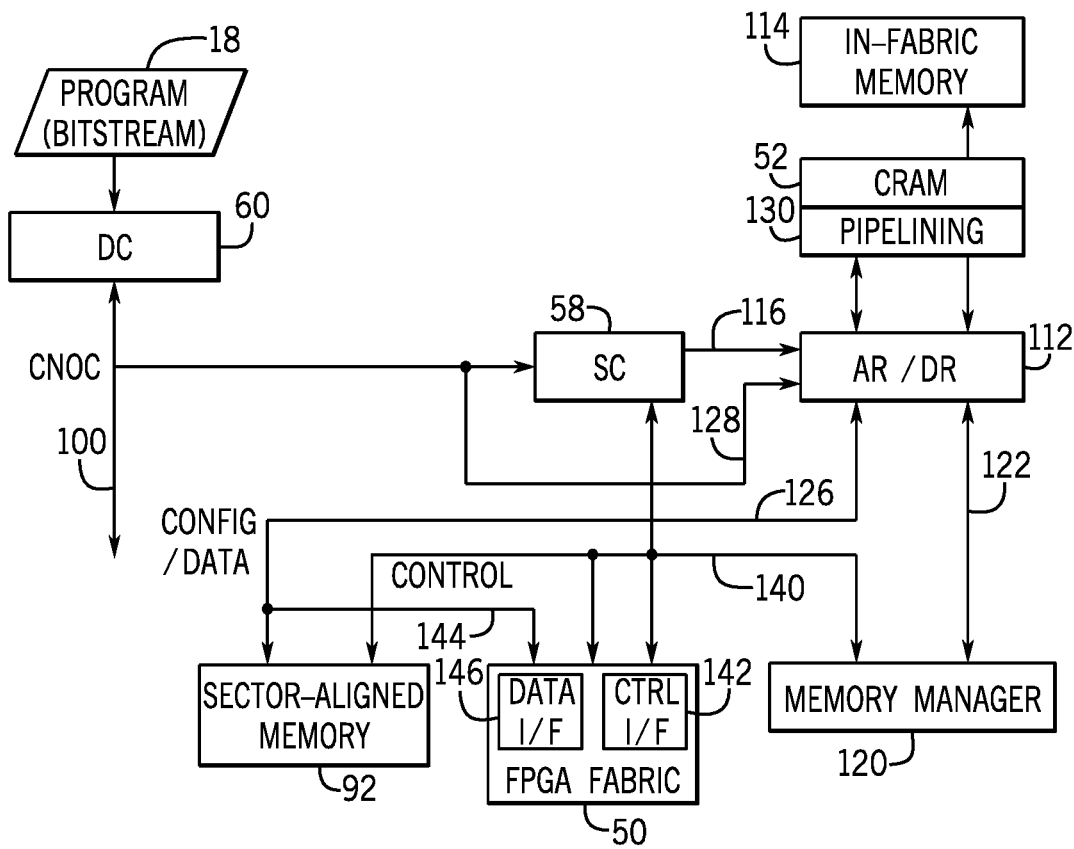
FIG. 10 is a block diagram of circuitry that may facilitate access to the sector-aligned memory by the programmable logic fabric using a sector controller and a memory manager for pipelining, in accordance with an embodiment.

For even faster programming, the programming of the CRAM 52 and/or in-fabric memory 114 may be pipelined, as shown in FIG. 10. A memory manager 120 may coordinate control of the AR/DR 112 via control pathways 122 and 124. The memory manager 120 may be located in the fabric die 22 and/or in the base die 24. The memory manager 120 may be implemented as a state machine and/or as a processor running software or firmware, and may control the data transfers to and/or from the sector-aligned memory 92 and the AR/DR 112 over a data pathway 126. The data pathway 126 may communicate data more rapidly than may be provided over the CNOC 100. The data pathway 126 may have a faster frequency and/or may carry data more widely, in parallel, than the CNOC 100.

The sector controller (SC) 58 may coordinate with the AR/DR 112 and the memory manager 120 to receive the bitstream 18 via a data pathway 128 from the CNOC 100 or from the sector-aligned memory 92. As mentioned above, the sector controller (SC) 58 may control whether to receive data of the bitstream 18 from the CNOC 100 or to get it from the sector-aligned memory 92, and/or whether to cache or pre-cache (e.g., in a cache prefetch) the bitstream 18 into the sector-aligned memory 92.

As with the circuitry of FIG. 9, in the circuitry of FIG. 10, a configuration program 20 implemented in the programmable logic fabric, as defined by the configuration of programmable logic elements 50 programmed by the configuration memory (CRAM) 52, may utilize the sector-aligned memory 92. The configuration program 20 programmed into the programmable logic elements 50 may do so in several ways. In one example, the configuration program 20 may directly access (e.g., read from or write to) the sector-aligned memory via the control pathway 140 coupled to the control interface (CTRL I/F) 142 and the data pathway 144 coupled to the data interface (DATA I/F) 146 for direct data transfers between the programmable logic fabric and the sector-aligned memory 92. The configuration program 20 may include a memory controller for the sector-aligned memory 92 implemented in the programmable logic elements 50, which may be referred to as a memory controller implemented in soft logic, or a hardened memory controller may be accessible to the control interface (CTRL I/F) 142 and the data interface (DATA I/F) 146. In another example, the configuration program 20 may communicate control signals to the sector controller (SC) 58 and/or the memory manager 120 via the control pathway 140. The configuration program 20 may instruct the sector controller (SC) 58 and/or the memory manager 120 to coordinate a data transfer to or from the sector-aligned memory 92. The configuration program 20 thus may include a soft processor or soft state machine to communicate with the sector controller (SC) 58 in this way, or hardened control circuitry may be disposed among the programmable logic elements 50 to communicate with the sector controller (SC) 58 and/or the memory manager 120.

Data from the CNOC 100 or the sector-aligned memory 92 may be loaded into the AR/DR 112 and pipelined into the CRAM 52 and/or in-fabric memory 114 via pipelining circuitry 130. The pipelining circuitry 130 may allow multiple cells of the configuration memory (CRAM) 52 to be programmed at once by pipelining multiple bits of data into registers of the AR/DR 112 before the AR/DR 112 programs multiple cells of the configuration memory (CRAM) 52 at once (e.g., instead of programming the configuration memory (CRAM) 52 one cell at a time). This may allow large quantities of data from the sector-aligned memory 92 to rapidly enter the CRAM 52 cells or the in-fabric memory 114. As noted above, this may take place much more quickly than the time involved in receiving the entire bitstream 18 via the CNOC 100. In some cases, it may be 50% faster, twice as fast, 5× as fast, 10× as fast, 20× as fast, 50× as fast, 100× as fast, 200× as fast, 500× as fast, 1000× as fast, or faster, to program the CRAM 52 and/or in-fabric memory 114 with bitstream 18 directly from sector-aligned memory 92 than to program the CRAM 52 and/or in-fabric memory 114 with the bitstream 18 from the CNOC 100.

Figure 11:
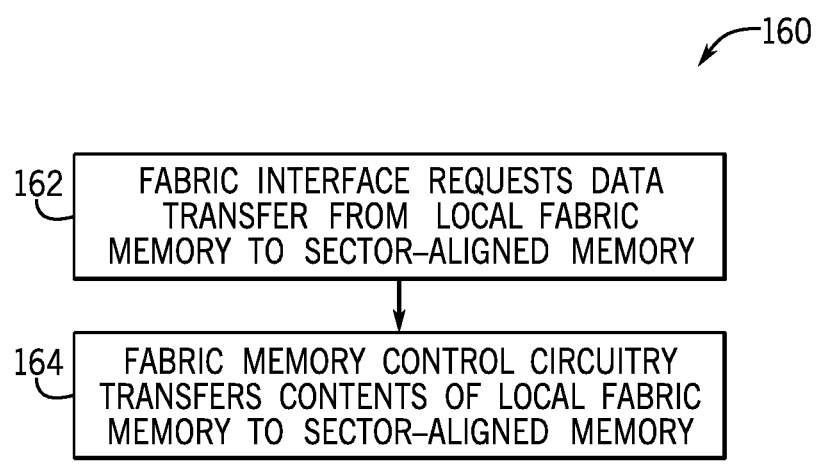
FIG. 11 is a flowchart of a method for transferring data from the programmable logic fabric to sector-aligned memory by the programmable logic fabric, in accordance with an embodiment.

In any suitable configuration that includes sector-aligned memory 92, including but not limited to those shown in FIGS. 9 and 10, data may be transferred to or from the sector-aligned memory 92 and used by the programmable logic fabric (e.g., a circuit design implemented by the programmable logic elements). In one example, shown by a flowchart 160 of FIG. 11, a circuit design such as the configuration program 20 may cause the control interface (CTRL I/F) 142 to issue a control signal on the control pathway 140 to the sector-aligned memory 92, the sector controller (SC) 58, and/or the memory manager 120 (block 162 of FIG. 11). The control signal may request data transfer from local fabric memory, such as the in-fabric memory 114 or registers of the programmable logic elements 50, to the sector-aligned memory 92. Control circuitry such as a soft or hardened controller implemented in the programmable logic elements 50, the control interface (CTRL I/F) 142 and the data interface (DATA I/F) 146, the sector controller (SC) 58, and/or the memory manager 120 may cause desired contents of the local fabric memory, such as the in-fabric memory 114 or registers of the programmable logic elements 50, to be stored in the sector-aligned memory 92 (block 164 of FIG. 11).

Figure 12:
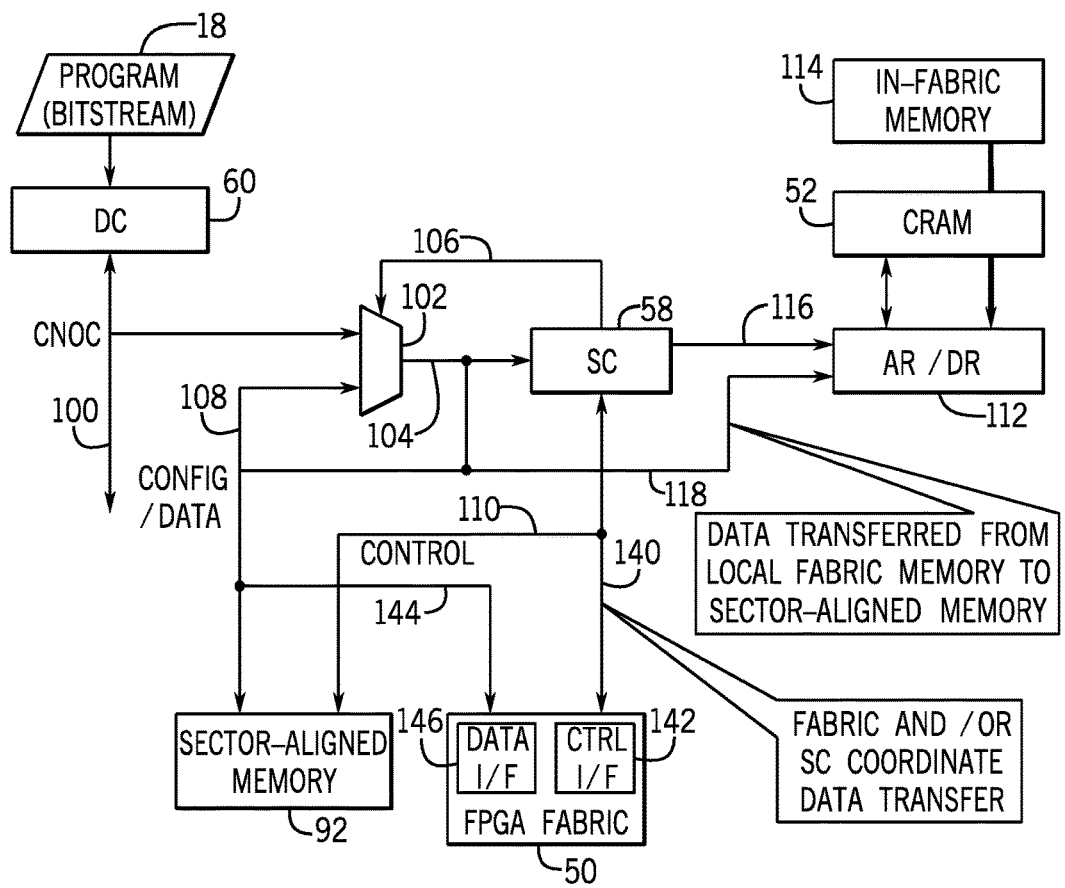
FIG. 12 is a block diagram illustrating an example of transferring data from programmable logic fabric to sector-aligned memory by a sector controller using the circuitry of FIG. 9, in accordance with an embodiment.

FIG. 12 represents an example of a data transfer from the in-fabric memory 114 to the sector-aligned memory 92 using the circuitry described above with reference to FIG. 9. As such, additional description of elements with the same numbering as those in FIG. 9 may be found in the text above. Here, the configuration program 20, control circuitry such as a soft or hardened controller implemented in the programmable logic elements 50, the control interface (CTRL I/F) 142 and the data interface (DATA I/F) 146, and/or the sector controller (SC) 58 may coordinate data transfer from the in-fabric memory 114 to the sector-aligned memory 92. The data from the in-fabric memory 114 may be downloaded into the AR/DR 112 under the direction of the sector controller (SC) 58, and the AR/DR 112 may pass the data to the sector-aligned memory 92.

Figure 13:
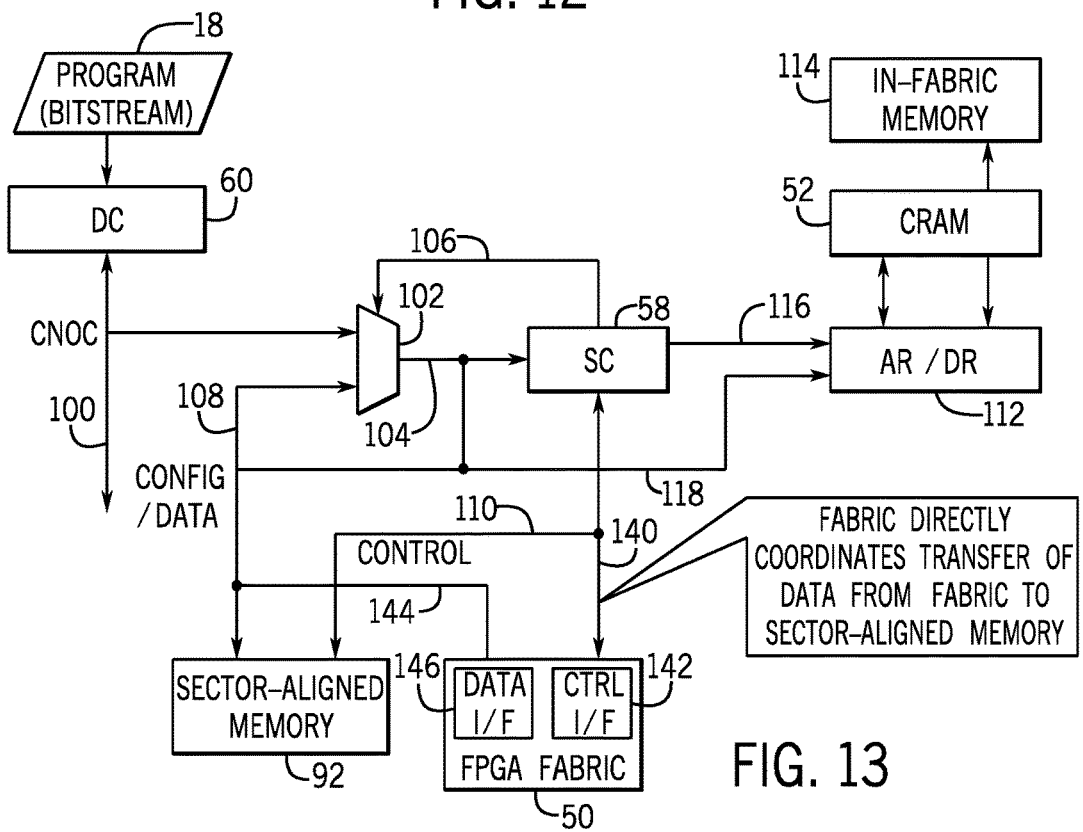
FIG. 13 is a block diagram illustrating an example of transferring data from programmable logic fabric to sector-aligned memory by a soft logic controller in the programmable logic fabric using the circuitry of FIG. 9, in accordance with an embodiment.

FIG. 13 represents another example of a data transfer from the in-fabric memory 114 and/or registers of the programmable logic elements 50 to the sector-aligned memory 92 using the circuitry described above with reference to FIG. 9. As such, additional description of elements with the same numbering as those in FIG. 9 may be found in the text above. Here, the configuration program 20, control circuitry such as a soft or hardened controller implemented in the programmable logic elements 50, and/or the control interface (CTRL I/F) 142 and the data interface (DATA I/F) 146 may coordinate data transfer from the in-fabric memory 114 and/or registers of the programmable logic elements 50 to the sector-aligned memory 92. The data from the in-fabric memory 114 and/or registers of the programmable logic elements 50 may be transferred from the data interface (DATA I/F) 146 to the sector-aligned memory 92 using the data pathway 144 under instruction from control signals on the control pathway 140 by the control interface (CTRL I/F) 142.

Figure 14:
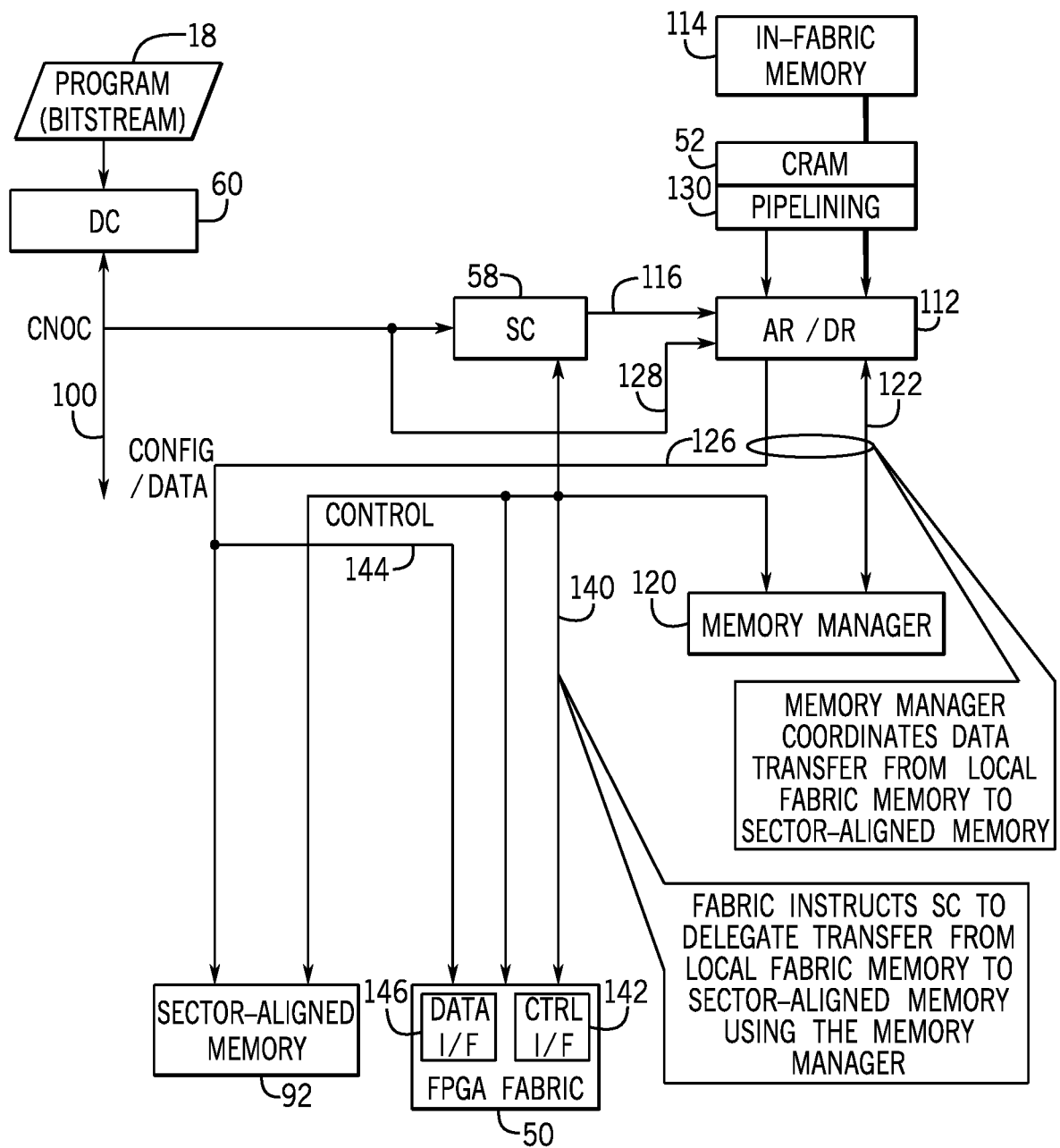
FIG. 14 is a block diagram illustrating an example of transferring data from programmable logic fabric to sector-aligned memory by a sector controller and a memory manager for pipelining using the circuitry of FIG. 10, in accordance with an embodiment.

FIG. 14 represents an example of a data transfer from the in-fabric memory 114 to the sector-aligned memory 92 using the circuitry described above with reference to FIG. 10. As such, additional description of elements with the same numbering as those in FIG. 10 may be found in the text above. Here, the configuration program 20, control circuitry such as a soft or hardened controller implemented in the programmable logic elements 50, the control interface (CTRL I/F) 142 and the data interface (DATA I/F) 146, the sector controller (SC) 58 and/or the memory manager 120 may coordinate data transfer from the in-fabric memory 114 to the sector-aligned memory 92. For example, the configuration program 20, control circuitry such as a soft or hardened controller implemented in the programmable logic elements 50, and/or the control interface (CTRL I/F) 142 and the data interface (DATA I/F) 146 may instruct the sector controller (SC) 58 to cause the memory manager 120 to carry out the data transfer. The data from the in-fabric memory 114 may be downloaded into the AR/DR 112 in a pipelined manner using the pipelining circuitry 130, under the control of the memory manager 120, which may enable large amounts of data to be rapidly transferred from the in-fabric memory 114 to the sector-aligned memory 92.

Figure 15:
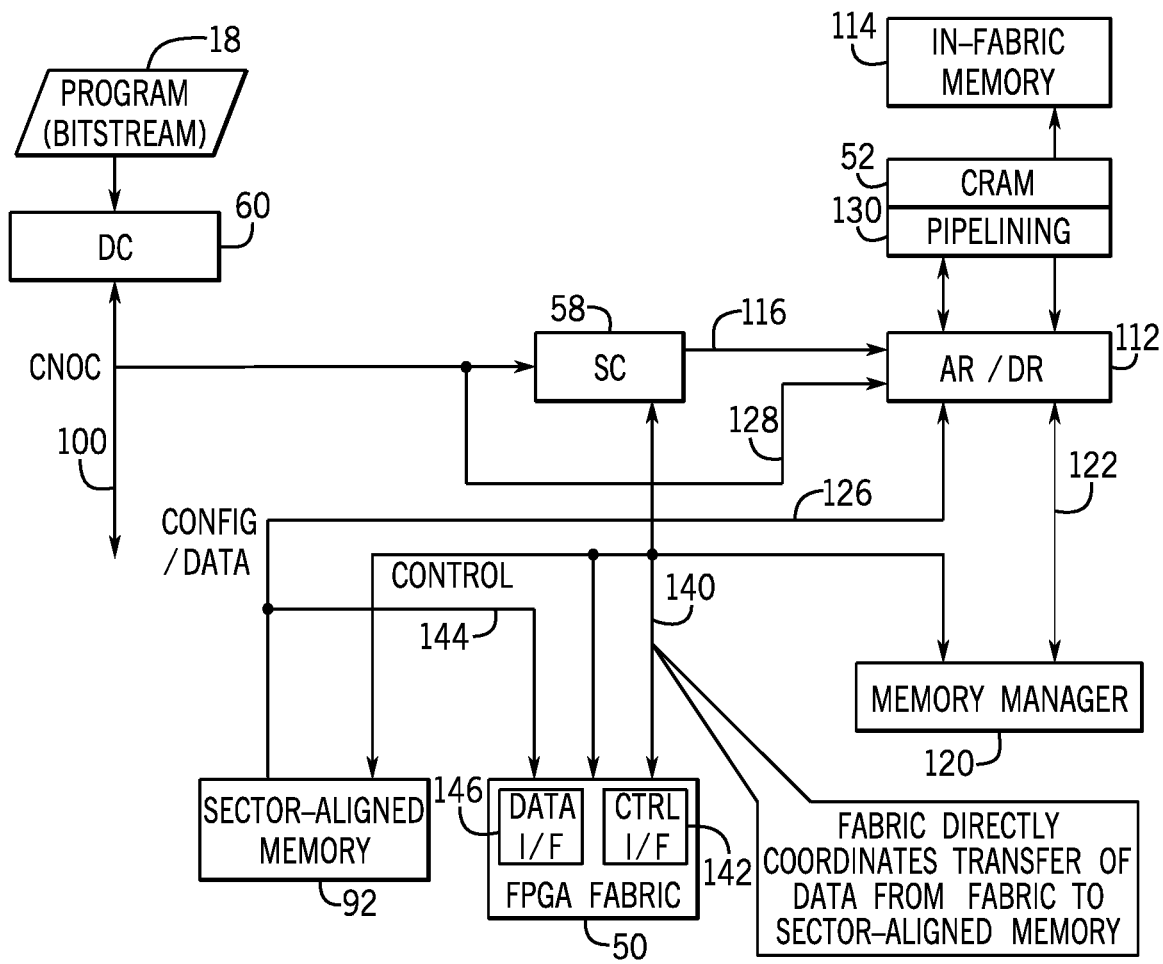
FIG. 15 is a block diagram illustrating an example of transferring data from programmable logic fabric to sector-aligned memory by a soft logic controller in the programmable logic fabric using the circuitry of FIG. 10, in accordance with an embodiment.

FIG. 15 represents another example of a data transfer from the in-fabric memory 114 and/or registers of the programmable logic elements 50 to the sector-aligned memory 92 using the circuitry described above with reference to FIG. 10. As such, additional description of elements with the same numbering as those in FIG. 10 may be found in the text above. Here, the configuration program 20, control circuitry such as a soft or hardened controller implemented in the programmable logic elements 50, and/or the control interface (CTRL I/F) 142 and the data interface (DATA I/F) 146 may coordinate data transfer from the in-fabric memory 114 and/or registers of the programmable logic elements 50 to the sector-aligned memory 92. The data from the in-fabric memory 114 and/or registers of the programmable logic elements 50 may be transferred from the data interface (DATA I/F) 146 to the sector-aligned memory 92 using the data pathway 144 under instruction from control signals on the control pathway 140 by the control interface (CTRL I/F) 142.

Figure 16:
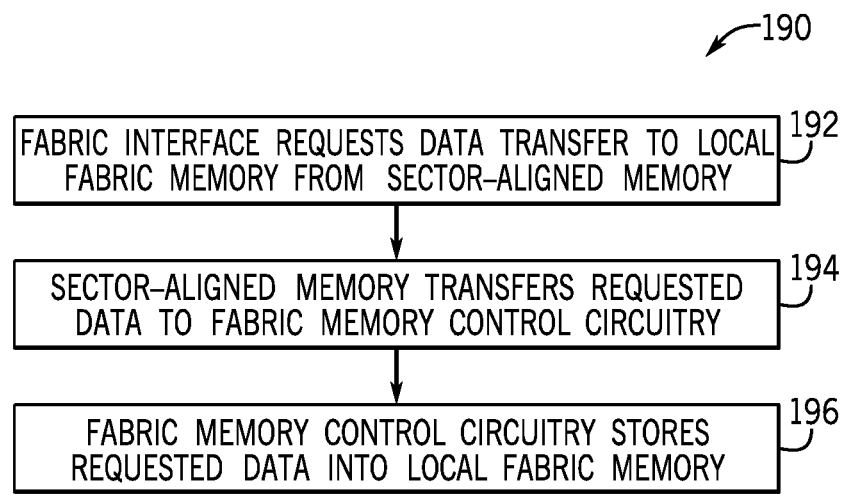
FIG. 16 is a flowchart of a method for transferring data from sector-aligned memory to the programmable logic fabric, in accordance with an embodiment.

Data may also be transferred from the sector-aligned memory 92 to the in-fabric memory 114 and/or a configuration program 20 in the programmable logic fabric (e.g., a circuit design implemented by the programmable logic elements). In one example, shown by a flowchart 190 of FIG. 16, a circuit design such as the configuration program 20 may cause the control interface (CTRL I/F) 142 to issue a control signal on the control pathway 140 to the sector-aligned memory 92, the sector controller (SC) 58, and/or the memory manager 120 (block 192 of FIG. 11). The control signal may request data transfer to local fabric memory, such as the in-fabric memory 114 or registers of the programmable logic elements 50, from the sector-aligned memory 92. Control circuitry such as a soft or hardened controller implemented in the programmable logic elements 50, the control interface (CTRL I/F) 142 and the data interface (DATA I/F) 146, the sector controller (SC) 58, and/or the memory manager 120 may cause desired contents of the sector-aligned memory 92 to be transferred to local fabric memory, such as the in-fabric memory 114 or registers of the programmable logic elements 50 (block 194 of FIG. 16). The transferred data may be stored into the in-fabric memory 114 and/or registers of the programmable logic elements 50 (block 196 of FIG. 16).

Figure 17:
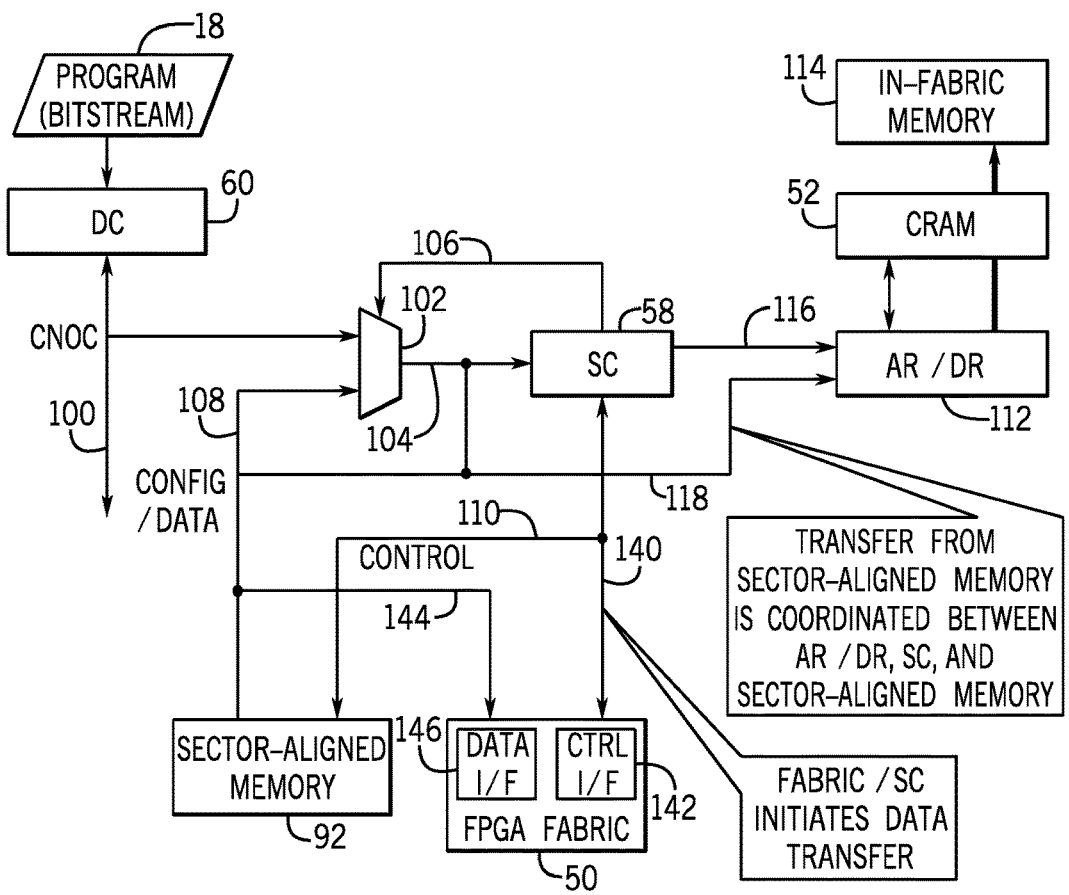
FIG. 17 is a block diagram illustrating an example of transferring data to programmable logic fabric from sector-aligned memory by a sector controller using the circuitry of FIG. 9, in accordance with an embodiment.

FIG. 17 represents an example of a data transfer to the in-fabric memory 114 from the sector-aligned memory 92 using the circuitry described above with reference to FIG. 9. As such, additional description of elements with the same numbering as those in FIG. 9 may be found in the text above. Here, the configuration program 20, control circuitry such as a soft or hardened controller implemented in the programmable logic elements 50, the control interface (CTRL I/F) 142 and the data interface (DATA I/F) 146, and/or the sector controller (SC) 58 may initiate a data transfer to the in-fabric memory 114 from the sector-aligned memory 92. The data from the sector-aligned memory 92 may be uploaded into the AR/DR 112, which may program the data into the in-fabric memory 114 under the direction of the sector controller (SC) 58.

Figure 18:
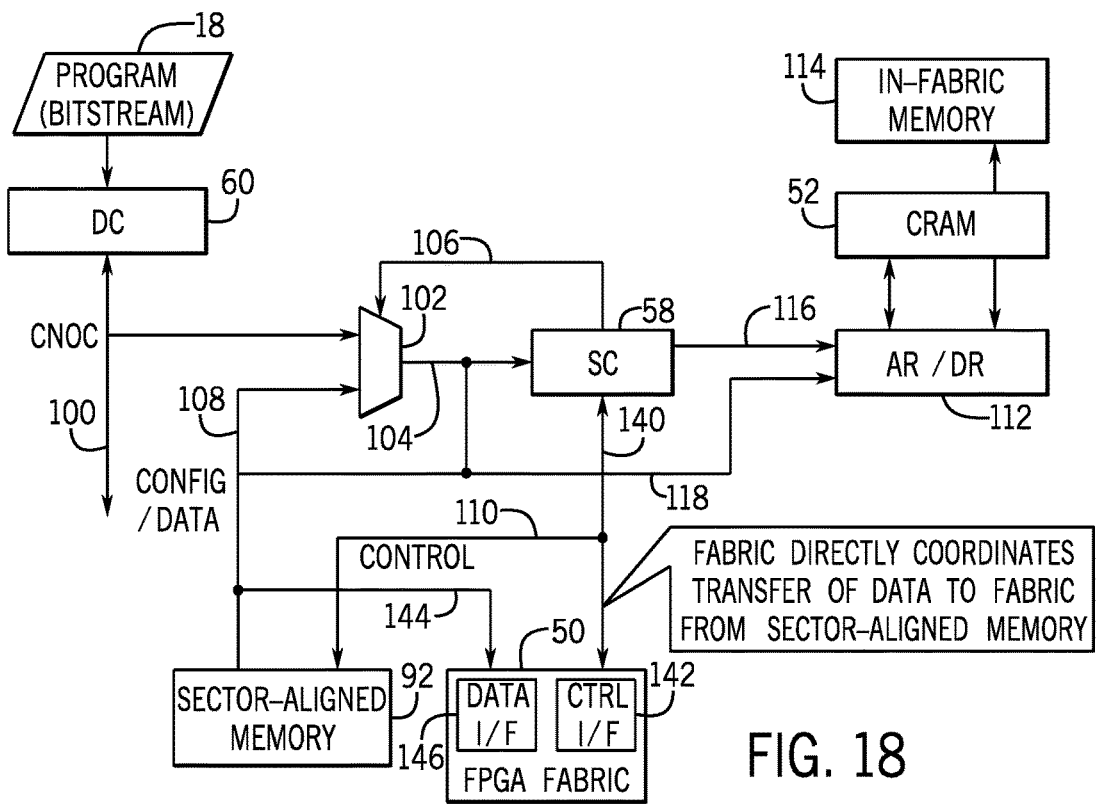
FIG. 18 is a block diagram illustrating an example of transferring data to programmable logic fabric from sector-aligned memory by a soft logic controller in the programmable logic fabric using the circuitry of FIG. 9, in accordance with an embodiment.

FIG. 18 represents another example of a data transfer to the in-fabric memory 114 and/or registers of the programmable logic elements 50 from the sector-aligned memory 92 using the circuitry described above with reference to FIG. 9. As such, additional description of elements with the same numbering as those in FIG. 9 may be found in the text above. Here, the configuration program 20, control circuitry such as a soft or hardened controller implemented in the programmable logic elements 50, and/or the control interface (CTRL I/F) 142 and the data interface (DATA I/F) 146 may coordinate data transfer to the in-fabric memory 114 and/or registers of the programmable logic elements 50 from the sector-aligned memory 92. The data from the sector-aligned memory 92 may be received on the data interface (DATA I/F) 146 and provided to the in-fabric memory 114 and/or registers of the programmable logic elements 50, using the data pathway 144 under instruction from control signals on the control pathway 140 by the control interface (CTRL I/F) 142.

Figure 19:
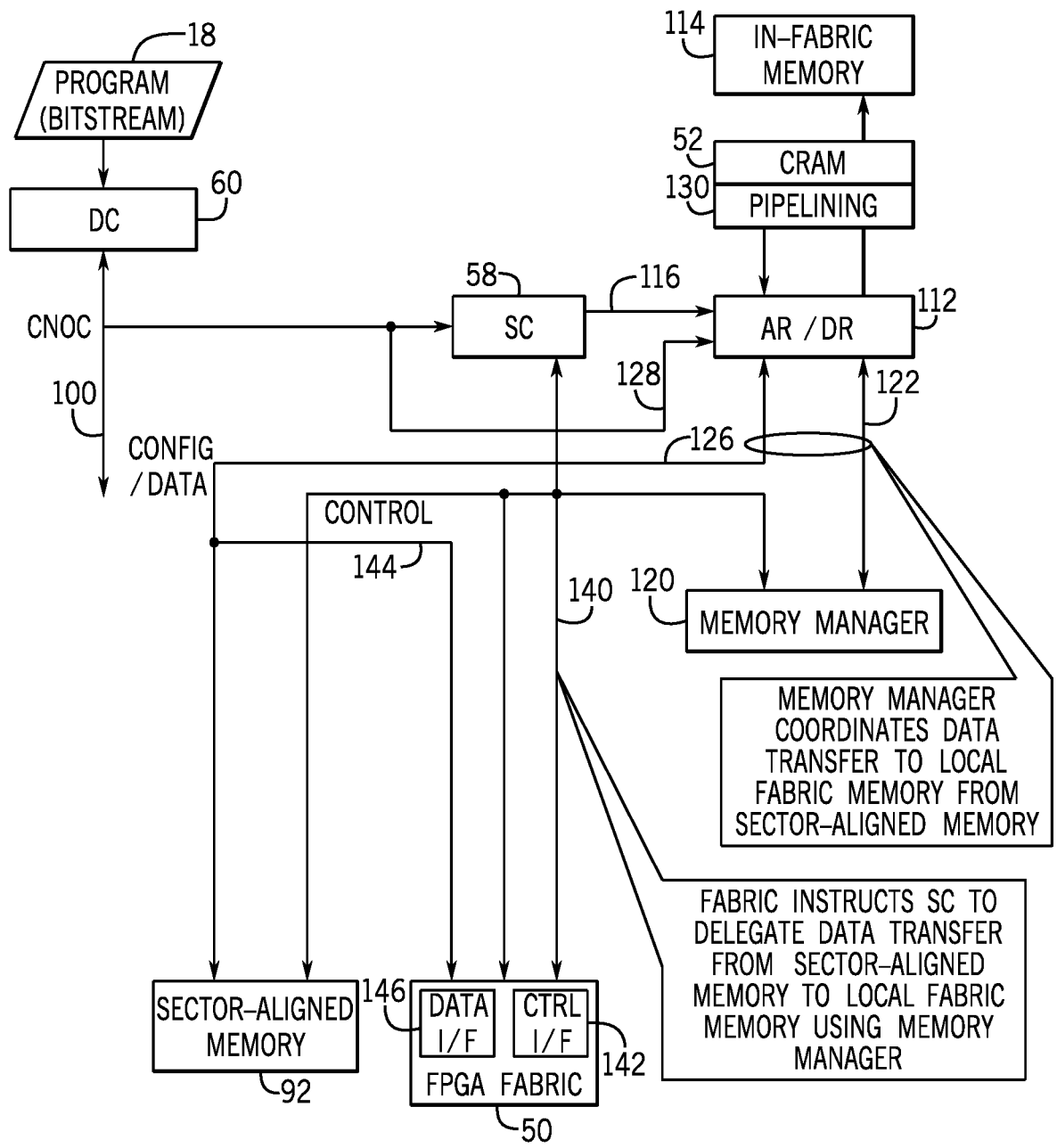
FIG. 19 is a block diagram illustrating an example of transferring data to programmable logic fabric from sector-aligned memory by a sector controller and a memory manager for pipelining using the circuitry of FIG. 10, in accordance with an embodiment.

FIG. 19 represents an example of a data transfer to the in-fabric memory 114 from the sector-aligned memory 92 using the circuitry described above with reference to FIG. 10. As such, additional description of elements with the same numbering as those in FIG. 10 may be found in the text above. Here, the configuration program 20, control circuitry such as a soft or hardened controller implemented in the programmable logic elements 50, the control interface (CTRL I/F) 142 and the data interface (DATA I/F) 146, the sector controller (SC) 58 and/or the memory manager 120 may coordinate data transfer from the in-fabric memory 114 to the sector-aligned memory 92. For example, the configuration program 20, control circuitry such as a soft or hardened controller implemented in the programmable logic elements 50, and/or the control interface (CTRL I/F) 142 and the data interface (DATA I/F) 146 may instruct the sector controller (SC) 58 to cause the memory manager 120 to carry out the data transfer. The data from the sector-aligned memory 92 may be uploaded into the AR/DR 112 and programmed into the in-fabric memory 114 in a pipelined manner using the pipelining circuitry 130, under the control of the memory manager 120. This may enable large amounts of data to be rapidly transferred to the in-fabric memory 114 from the sector-aligned memory 92.

Figure 20:
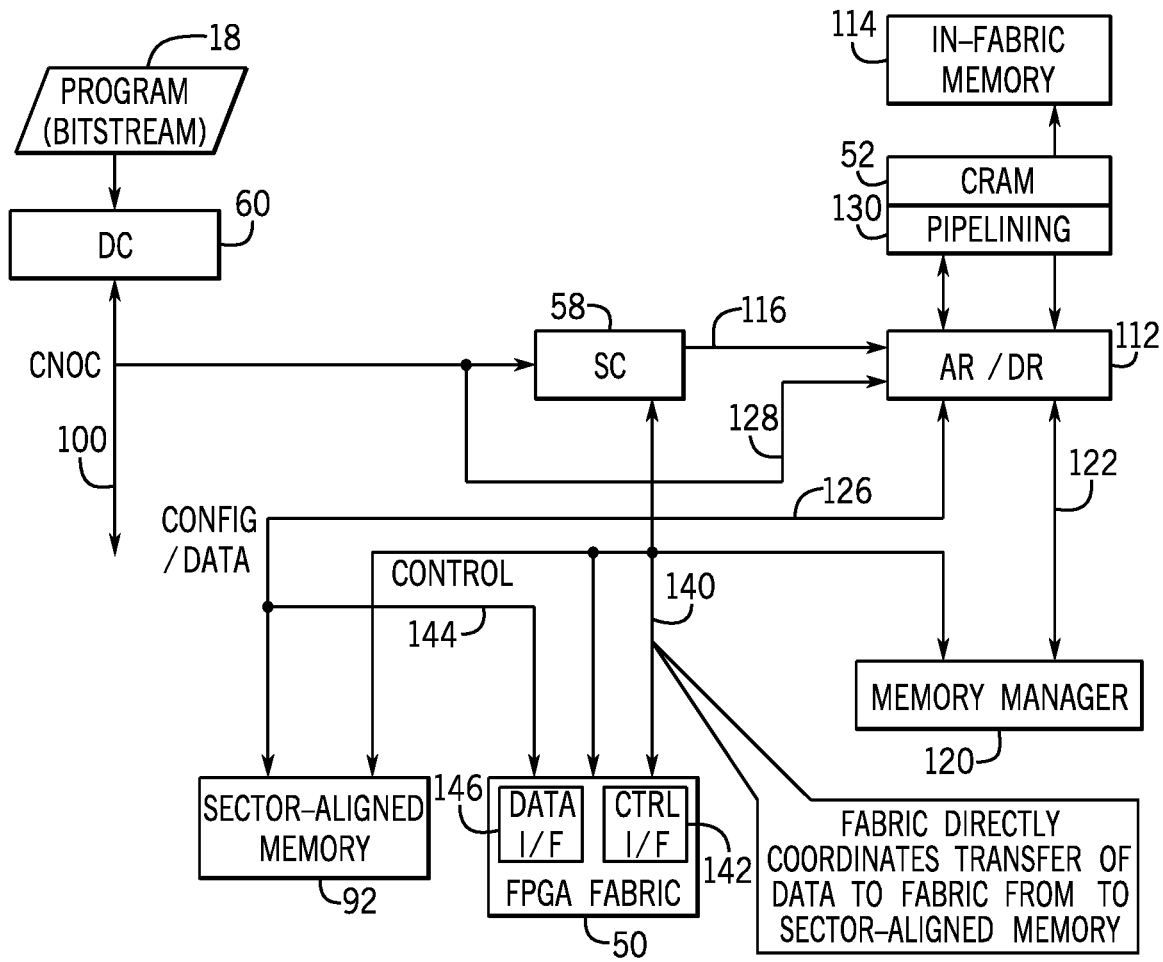
FIG. 20 is a block diagram illustrating an example of transferring data from programmable logic fabric to sector-aligned memory by a soft logic controller in the programmable logic fabric using the circuitry of FIG. 10, in accordance with an embodiment.

FIG. 20 represents another example of a data transfer from the in-fabric memory 114 and/or registers of the programmable logic elements 50 to the sector-aligned memory 92 using the circuitry described above with reference to FIG. 10. As such, additional description of elements with the same numbering as those in FIG. 10 may be found in the text above. Here, the configuration program 20, control circuitry such as a soft or hardened controller implemented in the programmable logic elements 50, and/or the control interface (CTRL I/F) 142 and the data interface (DATA I/F) 146 may coordinate data transfer to the in-fabric memory 114 and/or registers of the programmable logic elements 50 from the sector-aligned memory 92. The data from the sector-aligned memory 92 may be transferred to the data interface (DATA I/F) 146 to the sector-aligned memory 92 using the data pathway 144 under instruction from control signals on the control pathway 140 by the control interface (CTRL I/F) 142, and subsequently programmed into the in-fabric memory 114 and/or registers of the programmable logic elements 50.

Figure 21:
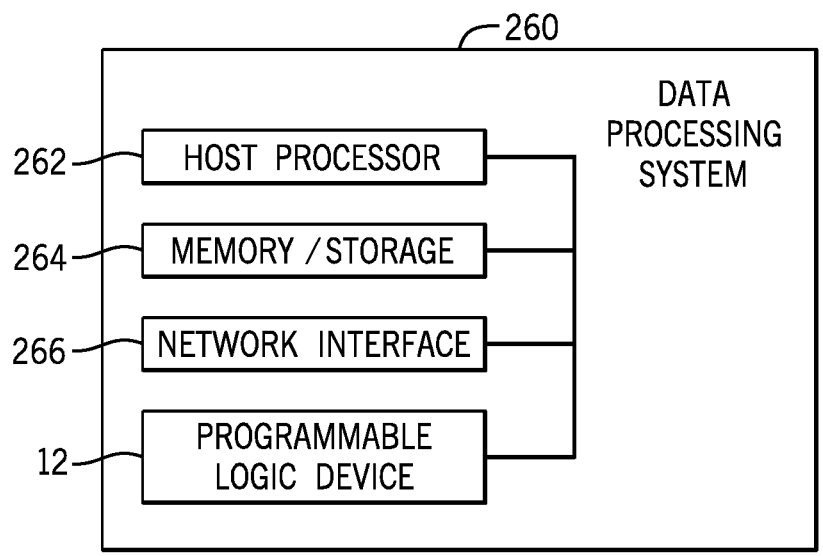
FIG. 21 is a block diagram of a data processing system that may use the programmable logic device to rapidly respond to data processing requests, in accordance with an embodiment.

The programmable logic device 12 may be, or may be a component of, a data processing system. For example, the programmable logic device 12 may be a component of a data processing system 260, shown in FIG. 21. The data processing system 260 includes a host processor 262, memory and/or storage circuitry 264, and a network interface 266. The data processing system 260 may include more or fewer components (e.g., electronic display, user interface structures, application specific integrated circuits (ASICs)). The host processor 262 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 260 (e.g., to perform machine learning, video processing, voice recognition, image recognition, data compression, database search ranking, bioinformatics, network security pattern identification, spatial navigation, or the like). The memory and/or storage circuitry 264 may include random access memory (RAM), read-only memory (ROM), one or more hard drives, flash memory, or the like. The memory and/or storage circuitry 264 may be considered external memory to the programmable logic device 12, and may hold data to be processed by the data processing system 260. In some cases, the memory and/or storage circuitry 264 may also store configuration programs (bitstreams) for programming the programmable logic device 12. The network interface 266 may allow the data processing system 260 to communicate with other electronic devices. The data processing system 260 may include several different packages or may be contained within a single package on a single package substrate.

In one example, the data processing system 260 may be part of a data center that processes a variety of different requests. For instance, the data processing system 260 may receive a data processing request via the network interface 266 to perform machine learning, video processing, voice recognition, image recognition, data compression, database search ranking, bioinformatics, network security pattern identification, spatial navigation, or some other specialized task. The host processor 262 may cause the programmable logic fabric of the programmable logic device 12 to be programmed with a particular accelerator related to requested task. For instance, the host processor 262 may instruct that configuration data (bitstream) stored on the memory/storage 264 or cached in sector-aligned memory of the programmable logic device 12 to be programmed into the programmable logic fabric of the programmable logic device 12. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 12 that are described here, the programmable logic device 12 may rapidly assist the data processing system 260 in performing the requested task. Indeed, in one example, an accelerator may assist with a voice recognition task less than a few milliseconds (e.g., on the order of microseconds) by rapidly accessing and processing large amounts of data in the accelerator using sector-aligned memory.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. An integrated circuit device comprising:
programmable logic fabric disposed on a first integrated circuit die, wherein the programmable logic fabric comprises a first sector of programmable logic fabric and a second sector of programmable logic fabric, wherein the first sector of programmable logic fabric is configured to be programmed with a circuit design that operates on a first set of data; and
sector-aligned memory disposed on a second integrated circuit die, wherein the sector-aligned memory comprises a first sector of sector-aligned memory directly accessible by the first sector of programmable logic fabric and a second sector of sector-aligned memory directly accessible by the second sector of programmable logic fabric, wherein the first sector of sector-aligned memory is configured to store the first set of data.

2. The integrated circuit device of claim 1, wherein:
the first integrated circuit die and the second integrated circuit die are vertically stacked; and
the first sector of programmable logic fabric is aligned with the first sector of sector-aligned memory.

3. The integrated circuit device of claim 1, wherein the first sector of programmable logic fabric comprises in-fabric memory having a first memory capacity, wherein the first sector of sector-aligned memory has a second memory capacity greater than or equal to the first memory capacity.

4. The integrated circuit device of claim 3, wherein the second memory capacity is greater than or equal to 100 times the first memory capacity.

5. The integrated circuit device of claim 1, wherein the first sector of programmable logic fabric comprises in-fabric memory configured to be written with data from the sector-aligned memory.

6. The integrated circuit device of claim 5, wherein the in-fabric memory is configured to be written with the data from the sector-aligned memory in a pipelined manner.

7. The integrated circuit device of claim 1, wherein the first sector of programmable logic fabric comprises a first set of configuration memory having a first memory capacity, wherein the first sector of sector-aligned memory has a second memory capacity greater than or equal to the first memory capacity.

8. The integrated circuit device of claim 1, wherein the first sector of sector-aligned memory is configured to be accessible by the first sector of programmable logic fabric in parallel while the second sector of sector-aligned memory is accessible by the second sector of programmable logic fabric.

9. A programmable logic device comprising:
a first sector of programmable logic fabric disposed in a first integrated circuit die, wherein the first sector of programmable logic fabric comprises a first set of programmable logic elements controlled by a respective first set of configuration memory cells;
a second sector of programmable logic fabric disposed in the first integrated circuit die, wherein the second sector of programmable logic fabric comprises a second set of programmable logic elements controlled by a respective second set of configuration memory cells;
a first sector of a sector-aligned memory disposed in a second integrated circuit die, wherein the first sector of the sector-aligned memory is connected to the first sector of programmable logic fabric via a first physical connection; and
a second sector of the sector-aligned memory disposed in the second integrated circuit die, wherein the second sector of the sector-aligned memory is connected to the second sector of programmable logic fabric via a second physical connection distinct from the first physical connection.

10. The programmable logic device of claim 9, wherein:
the first integrated circuit die and the second integrated circuit die are vertically stacked; and
the first sector of programmable logic fabric is aligned with the first sector of the sector-aligned memory; and
the second sector of programmable logic fabric is aligned with the second sector of the sector-aligned memory.

11. The programmable logic device of claim 9, wherein the first physical connection and the second physical connection are configured to enable a first data transfer between the first sector of the sector-aligned memory and the first sector of programmable logic fabric in parallel with a second data transfer between the second sector of the sector-aligned memory and the second sector of programmable logic fabric.

12. The programmable logic device of claim 9, comprising a first sector controller associated with the first sector of programmable logic fabric, wherein the first sector controller is configured to handle a request deriving from a circuit design implemented in the first sector of programmable logic fabric, wherein the request comprises a request to transfer data between the first sector of the sector-aligned memory and the first sector of programmable logic fabric.

13. The programmable logic device of claim 9, comprising:
first in-fabric memory disposed on the first integrated circuit die and associated with the first sector of programmable logic fabric; and
a first address register/data register configured to program the first in-fabric memory.

14. The programmable logic device of claim 13, comprising a first sector controller associated with the first sector of programmable logic fabric, wherein the first sector controller is configured to control the programming of the first in-fabric memory by controlling the first address register/data register.

15. The programmable logic device of claim 13, comprising:
a first sector controller associated with the first sector of programmable logic fabric; and
a first memory manager circuit associated with the first sector of programmable logic fabric, wherein the first sector controller is configured to coordinate the programming of the first in-fabric memory by instructing the first memory manager circuit to cause the first address register/data register to pipeline data into the first in-fabric memory.

16. A method for operating a programmable logic device, the method comprising:
requesting, by a circuit design implemented in a first sector of programmable logic fabric on a first integrated circuit die, a data transfer from the first sector of programmable logic fabric to an associated first sector of memory disposed on a second integrated circuit die or to the first sector of programmable logic fabric from the associated first sector of memory; and
in response to the request, using memory control circuitry disposed in the first integrated circuit die, the second integrated circuit die, or both, carrying out the data transfer from the first sector of programmable logic fabric to the associated first sector of memory disposed on the second integrated circuit die or to the first sector of programmable logic fabric from the associated first sector of memory.

17. The method of claim 16, wherein the request is provided via a hardened interface of the first sector of programmable logic fabric.

18. The method of claim 17, wherein the data transfer is carried out via a direct transfer between the hardened interface of the first sector of programmable logic fabric and the associated first sector of memory.

19. The method of claim 16, wherein the data transfer is carried out by an address register/data register via a data pathway between the address register/data register and the associated first sector of memory.

20. The method of claim 19, wherein carrying out the data transfer comprises reading data out of the first sector of programmable logic fabric through the address register/data register to the associated first sector of memory.

* * * * *